(12) United States Patent
Takagawa et al.

(10) Patent No.: US 6,700,793 B2
(45) Date of Patent: Mar. 2, 2004

(54) SEMICONDUCTOR DEVICE

(75) Inventors: Kyouichi Takagawa, Isesaki (JP);
Kozo Sakamoto, Hitachinaka (JP);
Nobuyoshi Matsuura, Takasaki (JP);
Masashi Koyano, Takasaki (JP)

(73) Assignee: Renesas Technology Corporation, Tokyo (JP)

( * ) Notice: Subject to any disclaimer, the term of this patent is extended or adjusted under 35 U.S.C. 154(b) by 103 days.

(21) Appl. No.: 10/046,261

(22) Filed: Jan. 16, 2002

(65) Prior Publication Data

US 2002/0093094 A1 Jul. 18, 2002

(30) Foreign Application Priority Data

Jan. 16, 2001 (JP) ........................................ 2001-007191

(51) Int. Cl.[7] .............................. H05K 7/02; H05K 7/06; H05K 7/08; H05K 7/10
(52) U.S. Cl. ........................................ 361/777; 361/778
(58) Field of Search ........................ 361/760, 777–778; 257/288, 327–330, 340–342

(56) References Cited

U.S. PATENT DOCUMENTS

| | | | | |
|---|---|---|---|---|
| 4,454,523 A | * | 6/1984 | Hill | 257/264 |
| 4,900,953 A | * | 2/1990 | Watanabe | 326/36 |
| 4,990,976 A | * | 2/1991 | Hattori | 257/379 |
| 5,185,649 A | * | 2/1993 | Bertotti et al. | 257/547 |
| 5,650,622 A | * | 7/1997 | Ookawa et al. | 250/332 |
| 6,208,200 B1 | * | 3/2001 | Arakawa | 327/589 |

OTHER PUBLICATIONS

Nick X. Sun, Alex Q. Huang and F.C. Lee, "0.35 $\mu$m, 43 $\mu\Omega$cm$^2$ power, 6 m$\Omega$ power MOSFET to power future microprocessor," 1999 IEEE, pp. 77–80.
Wharton McDaniel, "MOSFET selection is key to successful DC—DC conversion," Supplement to Electronic Design, Dec. 6, 1999, pp. 158–165.
Edward Stanford, "Device requirements for future CPU voltage regulators," Intel. Corp., pp. 1–6.

* cited by examiner

*Primary Examiner*—Kamand Cuneo
*Assistant Examiner*—Tuan Dinh
(74) *Attorney, Agent, or Firm*—Reed Smith LLP; Stanley P. Fisher, Esq.; Juan Carlos A. Marquez, Esq.

(57) ABSTRACT

Disclosed is a technique capable of improving a power supply efficiency in a power supply circuit. A power MOSFET in a high side of a combined power MOSFET constituting a DC-DC converter is constituted of a horizontal MOSFET, and a power MOSFET in a low side thereof is constituted of a vertical MOSFET.

9 Claims, 21 Drawing Sheets

SEMICONDUCTOR DEVICE

TECHNICAL FIELD OF THE INVENTION

The present invention relates to a technique for a semiconductor device. More particularly, the present invention relates to a technique effectively applicable to a semiconductor device having a power supply circuit.

BACKGROUND OF THE INVENTION

A DC-DC converter circuit, which is used as a power supply circuit for driving a CPU (Central Processing Unit) used in, for example, a personal computer or a server, has been required to have a low-voltage, large-current drive capability as well as a small size and a low power consumption. It is necessary that a coil incorporated in the power supply circuit is made smaller in order to achieve the downsizing of the power supply circuit. For its achievement, the increase of the PWM (Pulse Width Modulation) frequency is inevitably required. Also, it is necessary to reduce parasitic capacitance and on-resistance of a power MOSFET serving as a switching element of the power supply circuit in order to achieve the low power consumption. A principal portion of this power supply circuit is provided with a power MOSFET for a switching element and a power MOSFET for a rectifier. For the present, the PWM frequency is in a range of about 200 kHz to 500 kHz. Therefore, power MOSFETs having a vertical structure advantageous to low on-resistance are used as both of the power MOSFETs for the switching element and the rectifier.

Note that the power supply circuit is disclosed in, for example, IEEE "0.35 $\mu$m, 43 $\mu\Omega cm^2$, 6 m$\Omega$ Power MOSFET to Future Microprocessor" in 1999 (Virginia University), Electronic Design Dec. 6, 1999 "MOSFET selection is Key to successful DC-DC conversion", and "Device Requirements for Future cpu Voltage Regulators" Intel Corporation.

SUMMARY OF THE INVENTION

However, the inventors of the present invention found out that the power supply circuit technique described above had problems as follows.

Specifically, in the vertical power MOSFET, due to the structure in which a gate electrode region and a drain electrode region are layered on each other with a thin gate insulating film interposed therebetween, it is difficult to reduce parasitic capacitance between the gate and drain. Therefore, the pulse width becomes narrower in proportion to the further increase of the PWM frequency. Nonetheless, the rise of the pulse is slowed due to the parasitic capacitance, resulting in the increase of switching loss and drive loss. That is, there is a problem that it is impossible to achieve low parasitic capacitance and low on-resistance properties required to realize high power supply efficiency.

In addition, if power MOSFETs having the vertical structure are used as both of the power MOSFETs for a switching element and a rectifier, source electrodes thereof are inevitably connected by the bonding wire, and the problems of the reduction of the power supply efficiency and increase of the noise are caused due to the influence of an inductance component of the bonding wire.

An object of the present invention is to provide a technique capable of improving the power supply efficiency of a power supply circuit.

Another object of the present invention is to provide a technique capable of reducing an inductance component in a power supply circuit.

Another object of the present invention is to provide a technique capable of suppressing or preventing the generation of noise in a power supply circuit.

Another object of the present invention is to provide a technique capable of making a semiconductor device having a power supply circuit smaller in size.

Other objects and novel characteristics of the present invention will be apparent according to the description and the accompanying drawings of this specification.

The outline of the typical one of the inventions disclosed in this application will be described as follows.

Specifically, according to the present invention, a switch in a high side constituting a power supply circuit is constituted of a horizontal field effect transistor, and a switch in a low side is constituted of a vertical field effect transistor.

Also, according to the present invention, a source of the horizontal field effect transistor and a drain of the vertical field effect transistor are joined to a common conductor and are electrically connected to each other.

Also, according to the present invention, a semiconductor device comprises a first terminal for supplying a first potential; a first field effect transistor having a drain connected to the first terminal; a second field effect transistor having a drain electrically connected to a source of the first field effect transistor; and a second terminal for supplying a potential lower than the first potential and to which a source of the second field effect transistor is electrically connected, wherein the first field effect transistor is constituted of a horizontal field effect transistor and the second field effect transistor is constituted of a vertical field effect transistor.

Also, according to the present invention, a semiconductor device comprises a semiconductor region for a source formed on a first surface of a semiconductor chip; a semiconductor region for a drain formed on the first surface; a gate insulating film formed on the first surface between the semiconductor region for a source and the semiconductor region for a drain; a gate electrode formed on the gate insulating film; an insulating film deposited so as to cover the gate electrode on the first surface; an outer terminal for a gate provided on the insulating film and electrically connected to the gate electrode; an outer terminal for a drain provided on the insulating film and electrically connected to the semiconductor region for a drain; an outer terminal for a source formed on a second surface of the semiconductor chip opposite to the first surface; and connection means for electrically connecting the semiconductor region for a source on the first surface to the outer terminal for a source.

BRIEF DESCRIPTION OF THE DRAWINGS

FIG. 3B is also a timing chart of the power supply circuit shown in FIG. 1 where the output voltage of the power supply circuit of FIG. 3A is lowered relatively;

DESCRIPTION OF THE PREFERRED EMBODIMENTS

In the embodiments described below, the description will be made after being divided into a plurality of sections or embodiments when required as a matter of convenience. However, these sections or embodiments are not irrelevant to each other unless clearly specified to the contrary, and the one relates to the entire or a part of the other as a modification example, details, or a supplementary explanation thereof.

Also, in the embodiments described below, when referring to the number of an element (including number of pieces, values, amount, range, or the like), the number of the element is not limited to a specific number unless clearly specified or except the case where the number is apparently limited to a specific number in principle. The number larger or smaller than the specified number is applicable.

Further, in the embodiments described below, it goes without saying that the components (including element steps) are not always indispensable unless clearly specified or except the case where the components are apparently indispensable in principle.

Similarly, in the embodiments described below, when the shape of the components, positional relation thereof, and the like are mentioned, the substantially approximate and similar shapes and the like are included therein unless clearly specified to the contrary or except the case where it can be conceived that they are apparently excluded in principle. This condition is also applicable to the numerical value and the range described above.

Also, the components having the same function are added by the same reference symbol in the entire drawings for describing the embodiments, and repetitive descriptions thereof will be omitted.

Also, MOSFET (Metal Oxide Semiconductor Field Effect Transistor) is abbreviated simply as MOS in the embodiments.

Hereinafter, embodiments of the present invention will be described based on the drawings.

(First Embodiment)

Figure 1:
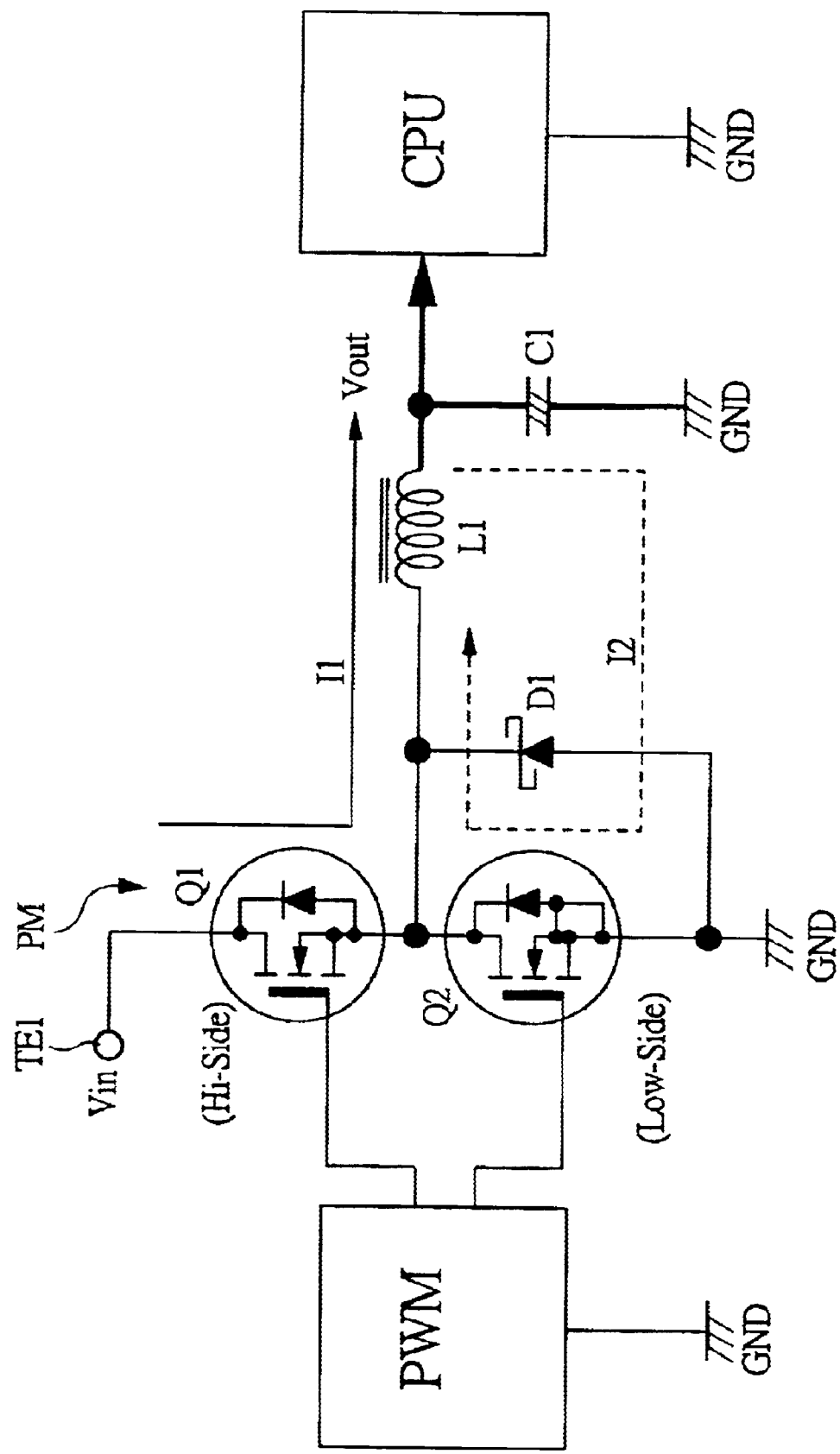
FIG. 1 is a circuit diagram of a power supply circuit according to an embodiment of the present invention.
Figure 2A:
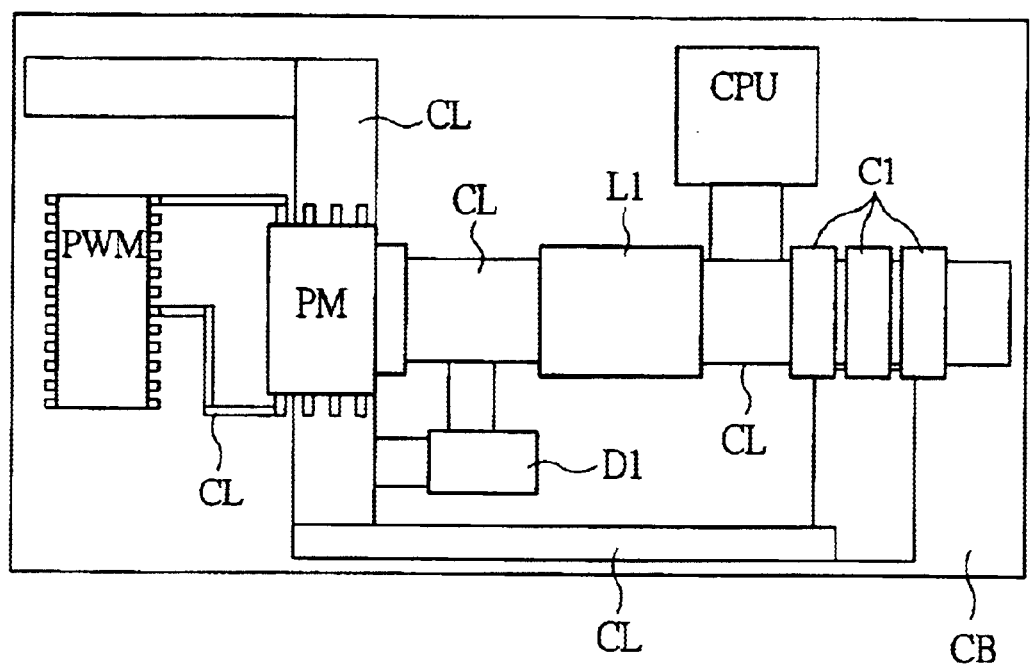
FIG. 2A is a plan view showing a state in which packages constituting the power supply circuit of FIG. 1 are mounted.
Figure 2B:
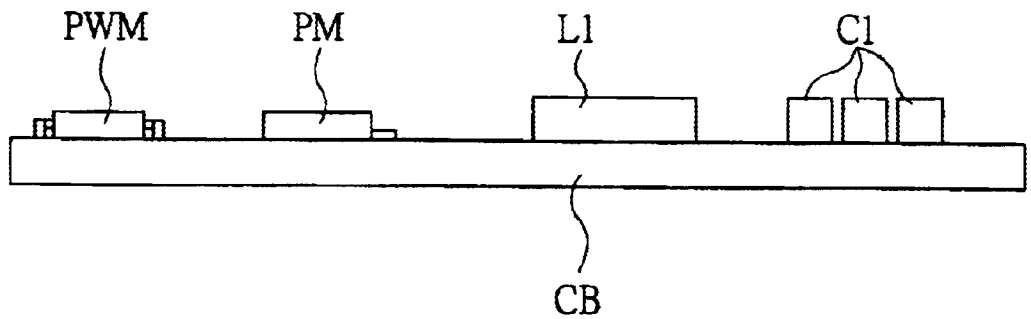
FIG. 2B is a side view of FIG. 2A.

First, a power supply circuit of this embodiment will be described based on FIGS. 1 to 4. FIGS. 1 and 2 exemplify a VRM (Voltage Regulator Module) for driving a CPU (Central Processing Unit), which is used in, for example, a personal computer, a server or the like. In this embodiment, a non-insulating DC-DC converter is shown as an example of the VRM. Note that FIG. 1 shows a circuit diagram of the VRM. The reference numerals GND in FIG. 1 represent a reference potential, and the reference potential is set to 0V in this embodiment. Also, FIG. 2 shows a state in which packages are mounted. FIG. 2A is a plan view of the VRM, and FIG. 2B is a side view of FIG. 2A.

The non-insulating DC-DC converter is provided with elements such as a pulse width modulation circuit PWM, a combined power MOS PM (n channel type power MOSs Q1 and Q2 (first and second field effect transistors)), a zener diode D1, a coil L1 having iron core therein, and an electrolytic capacitor C1. These elements are mounted on a circuit board CB and are electrically connected to each other via wiring CL on the circuit board CB.

The pulse width modulation circuit PWM applies a predetermined bias voltage to gate electrodes of the power MOSs Q1 and Q2 to control the pulse width for the turn-on and off of the power MOSs Q1 and Q2. Note that the pulse width modulation circuit PWM is packaged separately from the power MOSs Q1 and Q2 and the like (refer to FIG. 2).

The power MOS Q1 in a high side (high potential side: first operating voltage) of the combined power MOS PM is a main switch of the non-insulating DC-DC converter, and it also functions as a switch to store an energy in the coil L1, which supplies electric power to an output of the non-insulating DC-DC converter (input of the CPU). In this embodiment, this power MOS Q1 is constituted of a horizontal MOS, and detail description thereof will be made later. A drain of the power MOS Q1 is connected to a terminal (first power supply terminal) TE1. An input voltage Vin applied to the terminal TE1 is about 5 to 10V or about 12V. Also, a source of the power MOS Q1 is connected to a drain of the power MOS Q2 in a low side (low potential side: second operating voltage).

The power MOS Q2 in the low side of the combined power MOS PM is a MOS used for the rectification in the non-insulating DC-DC converter, and it functions to perform the rectification by lowering the resistance of the MOS synchronously with the PWM frequency. In this embodiment, the power MOS Q2 is constituted of a vertical MOS, and detail description thereof will be made later. A source of the power MOS Q2 is connected to the reference voltage (second power supply terminal) GND. These power MOSs Q1 and Q2 are packaged in the same package.

In addition, since a schottky diode D1 is connected between the source and the drain of the power MOS Q2, it is possible to reduce the voltage drop during the dead time when the power MOS Q2 is turned-off. Therefore, a subsequent quick rise of the pulse waveform can be obtained. In this embodiment, though the schottky diode D1 is packaged separately from the power MOS Q2, the schottky diode D1 and the power MOS Q2 may be packaged in the same package.

Figure 3A:
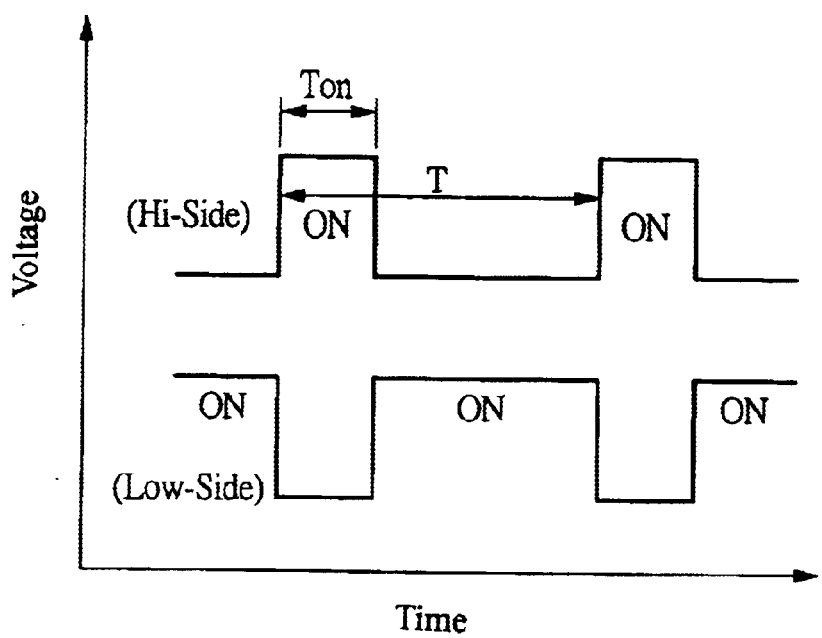
FIGS. 3A 3B is a timing chart of the power supply circuit shown in FIG. 1
Figure 3B:
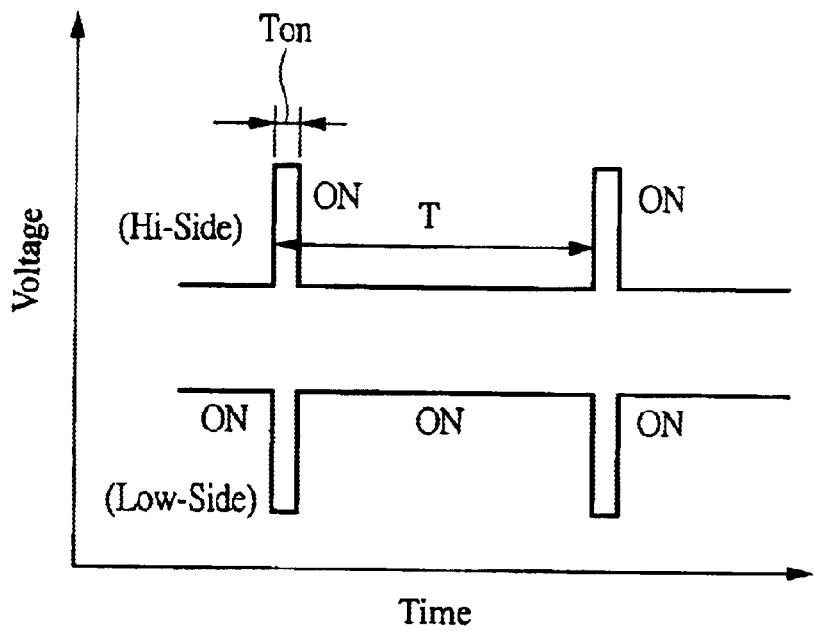

In the DC-DC converter like this, a current I1 flows when the power MOS Q1 in the high side is turned-on, and a current I2 flows when the power MOS Q1 in the high side is turned-off due to a counter electromotive voltage of the coil L1. When the current I2 flows, a positive voltage is applied between the gate and the source of the power MOS Q2 in the low side to turn-on the power MOS Q2, thereby enabling to reduce the voltage drop. FIGS. 3A and 3B are timing charts of the DC-DC converter. "Ton" represents the pulse width at the time when the power MOS Q1 in the high side is turned-on, and "T" represents a pulse cycle. FIG. 3B shows the case where the output voltage of the DC-DC converter of FIG. 3A is lowered relatively. Here, an output voltage Vout of the DC-DC converter is expressed by the formula of: Vout=(Ton/T)Vin, where "Ton/T" represents a duty factor in the power MOS Q1 in the high side.

Incidentally, the reduction of the output voltage Vout (that is, input voltage of CPU) has been promoted in recent years. On the other hand, the input voltage Vin is not changed and remains the same. Consequently, as shown in FIG. 3B and apparent from the formula above, when the output voltage Vout is reduced, the on-time of the power MOS Q1 in the high side becomes extremely short. Therefore, a high-speed operation is required in the high side.

Also, it is necessary to make a coil smaller in order to achieve the downsizing of the DC-DC converter. However, if the coil is made smaller, ripples in the output waveform are increased. Therefore, the higher PWM frequency is demanded so as to remove the ripples and to make the output waveform smooth. According to the study made by the inventors of the present invention, it was found out that it was impossible to ensure the sufficient power supply efficiency in the case where the PWM frequency is 1 MHz or higher and the power MOS Q1 in the high side is constituted of the vertical MOS. The reasons therefor are as follows. In the vertical MOS, due to the structure in which a gate electrode and a drain electrode are layered on each other with a thin gate insulating film interposed therebetween, it is difficult to reduce the parasitic capacitance (parasitic capacitance between the gate and the drain, or the like). Therefore, the pulse width becomes narrower in proportion to the further increase of the PWM frequency. Nonetheless, the rise of the pulse is slowed due to the parasitic capacitance and the high-speed operation can not be achieved, resulting in the increase of the switching loss and the drive loss.

Figure 4:
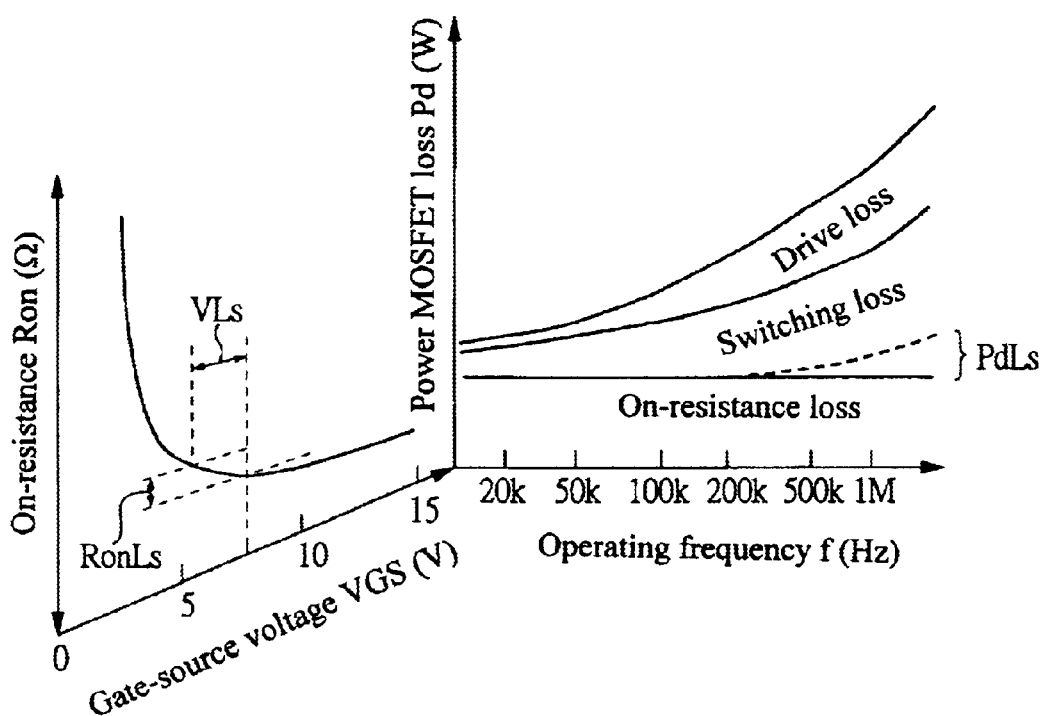
FIG. 4 is an explanatory graph of the effects by the power supply circuit of FIG. 1.

FIG. 4 shows a relation between an operating frequency f and loss of the power MOS Pd and the like. It can be understood that if the operating frequency is increased, the switching loss and the drive loss are increased. The switching loss Pds can be expressed by the formula of: Pds=(½)Vin·Id·tf·f(W), tf=rg·(Qgd/(VGS(on)−Vth))log(VGS(on)/Vth). Herein, "Id" is a drain current of the power MOS Q1, and "rg" is an inner gate resistance of the power MOS. Qgd is a gate-drain charge of the power MOS Q1. VGS (on) is a gate-source voltage when the power MOS Q1 is turned-on. Vth is a threshold voltage of the power MOS Q1. Also, the drive loss Pdrive can be expressed by the formula of: Pdrive=f·Qg·VGS. Herein, Qg is a total gate charge (a charge at the time when a specific gate bias is applied) of the power MOS Q1.

As described above, the vertical MOS has a limitation in its ability when used to constitute the power MOS Q1 in the high side. Therefore, in this embodiment, the horizontal MOS is used to constitute the power MOS Q1 in the high side as described above. By so doing, feedback capacitance can be reduced to about one tenth of that when the power MOS Q1 is constituted of the vertical MOS. Thereby, it becomes possible to reduce the capacitance (gate-drain capacitance or the like) to one tenth. Thus, based on the above-described formulas for the switching loss and the drive loss, the switching loss and the drive loss can be reduced to one tenth. Consequently, the frequency ten times as high can be obtained. The reason why the capacitance (gate-drain capacitance or the like) can be reduced when using the horizontal MOS is that the distance between the gate electrode and the drain electrode is made longer than that of the vertical MOS.

On the other hand, when the output voltage Vout is reduced, on-time of the power MOS Q2 in the low side becomes longer as shown in FIG. 3B. In other words, there is no need for paying so much attention to the switching loss and the like in the low side. However, low on-resistance is required from a point of view that low power consumption is needed because of the long on-time of the power MOS Q2. Therefore, in this embodiment, the power MOS Q2 in the low side is not constituted of the horizontal MOS but constituted of the vertical MOS as described above. In the vertical MOS, the channel length thereof is short, which makes it possible to increase the mutual conductance. In other words, since the reciprocal number of the mutual conductance is equivalent to the on-resistance, the low on-resistance can be achieved. As shown in FIG. 4, on-resistance loss is approximately constant regardless of the operating frequency. The on-resistance loss can be expressed by the formula of: $Id^2 \cdot Ron$. Therefore, the reduction of the on-resistance loss can be achieved by reducing the on-resistance Ron.

Incidentally, when a vertical MOS is used as the power MOS Q1 in the high side, it is impossible to mount the power MOS Q1 in the high side and the power MOS Q2 in the low side on a common substrate (frame), and the connection between the source of the power MOS Q1 and the substrate must be made by the use of a bonding wire (hereinafter, referred to as wire). Consequently, the inductance (source inductance) of the wire causes an adverse effect on the operating voltage, and thereby the nominal on-resistance RonLs and on-resistance loss PdLs shown in FIG. 4 are increased, resulting in the occurrence of such problems of reduction of the power supply efficiency and the increase of the noise. When the power MOS Q1 is constituted of the vertical MOS, VGS can be expressed by the formula of: VGS=VGS (drive)−VLs. Herein, VLs can be expressed by the formula of: VLs=2 πf·Ls·Id. Ls is the inductance of the wire. Herein, assuming that Ton=100 ns, Ls=5 nH, and Id=10 A are given, VLs=3V can be obtained. Note that the inductance Ls of the wire is generally in a range of, for example, about 2 to 10 nH. In addition, a drain current Id of the power MOS in the high side is usually in a range of, for example, about 10 to 20 A.

Contrary to this, in this embodiment, a horizontal MOS is used as the power MOS Q1 in the high side and a vertical MOS is used as the power MOS Q2 in the low side as described above. Therefore, the power MOSs Q1 and Q2 can be mounted on a common substrate (frame, conductor). In other words, a structure can be obtained in which the power MOS Q1 in the high side and the power MOS Q2 in the low side are connected in series via a frame 1. By so doing, the wire used to connect the source and the substrate can be removed, and thus source inductance in the high side can be reduced. Therefore, the adverse effect on the operating voltage of the power MOS Q1 in the high side caused by the source inductance can be prevented, and thereby the increase of the nominal on resistance can be prevented. Also, the noise reduction or prevention can be attained, and it becomes possible to deal with the high-frequency operation. Moreover, the improvement in the packing density is also achieved. Note that description for the package structure in which the power MOSs are mounted on a common substrate (frame) will be made later.

As is understood from the foregoing, according to this embodiment, the switching loss, the on-resistance loss, and the drive loss can be reduced in the high-frequency operation of the DC-DC converter (power supply circuit), and both of the downsizing and high efficiency in the DC-DC converter can be achieved simultaneously.

Figure 5:
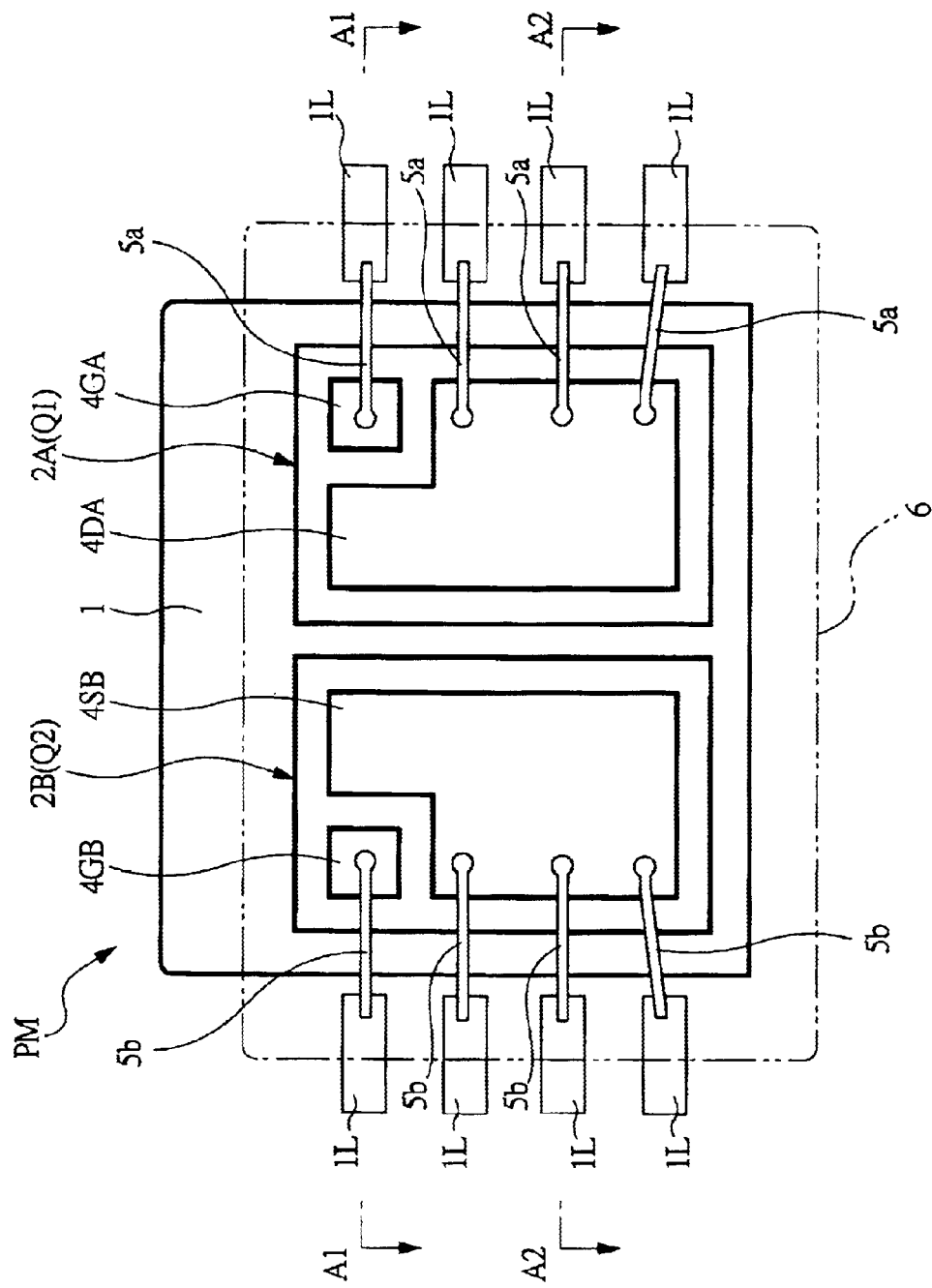
FIG. 5 is a plan view of a combined power MOSFET.
Figure 6A:
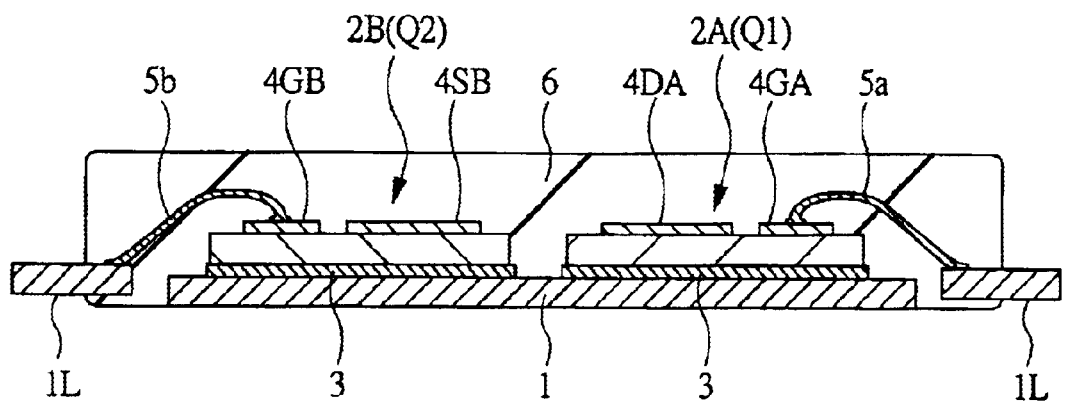
FIG. 6A is a cross-sectional view taken along the line A1—A1 of FIG. 5
Figure 6B:
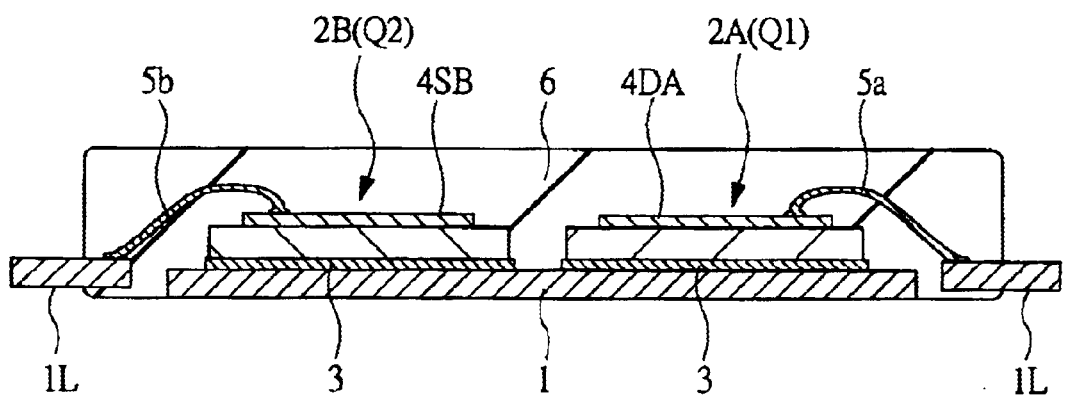
FIG. 6B is a cross-sectional view taken along the line A2—A2 of FIG. 5.

Next, a package structure of the combined power MOS PM will be described based on FIGS. 5 and 6. FIG. 5 is a plan view of the combined power MOS PM, and FIG. 6A and 6B are cross-sectional views taken along the lines A1—A1 and A2—A2 of FIG. 5.

The frame (substrate) 1 is made of a square thin plate obtained by plating a surface of metal such as copper with nickel or gold. On a main surface of the frame 1, two semiconductor chips (hereinafter, referred to as chip) 2A and 2B are arranged next to each other with main surfaces thereof facing upward. The two semiconductor chips 2A and 2B are bonded to the frame 1 at their rear surfaces via an adhesive 3 such as silver-containing paste.

The power MOS Q1 constituted of the horizontal MOS is formed on the chip (first semiconductor chip) 2A in the right side of FIG. 5. On a main surface (first surface, first main surface) of the chip 2A, a gate extraction electrode (outer terminal for a gate) 4GA and a drain extraction electrode (outer terminal for a drain) 4DA having a relatively larger area in comparison to the gate extraction electrode 4GA are patterned. The gate extraction electrode 4GA and the drain extraction electrode 4DA are made of, for example, aluminum or aluminum alloy, and are electrically connected to leads 1L via wires 5a. The wire 5a is made of, for example, gold or aluminum. Even if the relative positions of the gate extraction electrode 4GA and the drain extraction electrode 4DA to the lead 1L are dislocated to some extent, the dislocation can be corrected by the use of the wire 5a and the connection therebetween can be made. Therefore, the assembly thereof is facilitated. The lead 1L is made of the same material as that of the frame 1. On the other hand, a rear surface (second surface, second main surface) of the chip 2A functions as the source of the power MOS Q1, and is electrically connected to the frame 1 via the adhesive 3.

The power MOS Q2 constituted of the vertical MOS is formed on the chip (second semiconductor chip) 2B in the left side of FIG. 5. On a main surface of the chip 2B, a gate extraction electrode 4GB and a source extraction electrode 4SB having a relatively larger area in comparison to the gate extraction electrode 4GB are patterned. The gate extraction electrode 4GB and the source extraction electrode 4SB are made of, for example, aluminum or aluminum alloy, and are electrically connected to leads 1L via wires 5b. The wire 5b is made of, for example, the same material as that of the wire 5a. Also in this case, even if the relative positions of the gate extraction electrode 4GB and the source extraction electrode 4SB to the lead 1L are dislocated to some extent, the dislocation can be corrected by the use of the wire 5b and the connection therebetween can be made. Therefore, the assembly thereof is facilitated. On the other hand, a rear surface of the chip 2B functions as the drain of the power MOS Q2, and is electrically connected to the frame 1 via the adhesive 3. Specifically, the source of the chip 2A and the drain of the chip 2B are electrically connected to each other via the frame 1. Therefore, the wire to connect the source of the power MOS Q1 to the frame 1 becomes unnecessary, which makes it possible to achieve the improvement of the power supply efficiency, the reduction or the prevention of the noise, and the improvement of the packing density.

In this embodiment as described above, the chips 2A and 2B having different capacitances in design (especially, gate-drain capacitance) are arranged next to each other on the frame 1 as a common substrate. The two chips 2A and 2B, the wires 5a and 5b, the frame 1, and the lead 1L are sealed by sealing resin 6. An edge portion and a rear surface (a surface opposite to that having the chips 2A and 2B arranged thereon) of the frame 1 are exposed from the sealing resin. Owing to such a structure, the heat generated in the operation of the chips 2A and 2B is easily radiated to the outside of the sealing resin 6 through the frame 1. Especially, since the frame 1 can take a large area in this package structure, it is possible to improve the heat radiation efficiency. In addition, an end portion of the lead 1L is exposed from the sealing resin 6 and the end portion forms an outer lead. The outer lead is electrically connected to the wiring CL via a land or the like of the circuit board CB shown in FIG. 2.

The combined power MOS PM like this can be manufactured as follows. Specifically, after arranging the chips 2A and 2B next to each other on the same surface of the frame 1 via the adhesive 3, each of the electrodes of the chips 2A and 2B is connected to the leads 1L of the frame 1 by the wires 5a and 5b. Thereafter, the chips 2A and 2B, the wires 5a and 5b, frame 1, and lead IL are sealed by the sealing resin 6, and finally, it is divided into separate packages, and then the outer lead of the lead 1L is formed.

Figure 7:
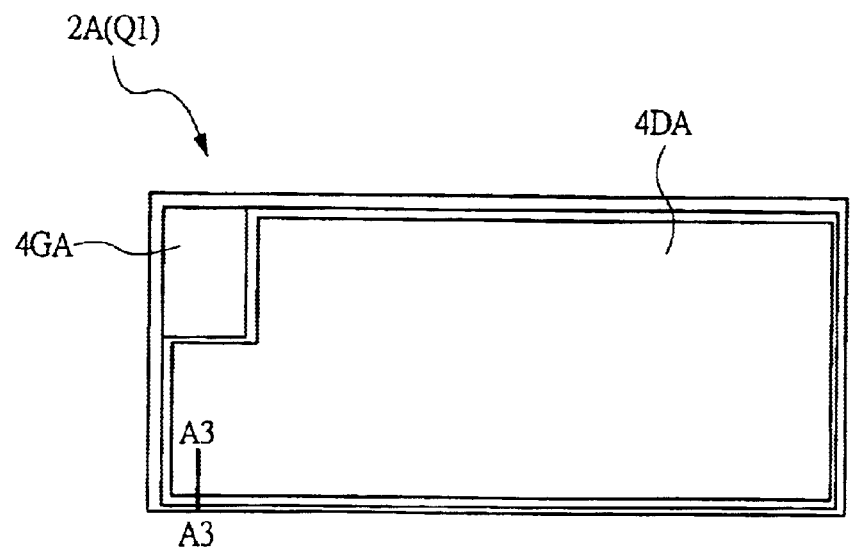
FIG. 7 is a plan view showing one of the semiconductor chips constituting the combined power MOSFET of FIG. 5.
Figure 8:
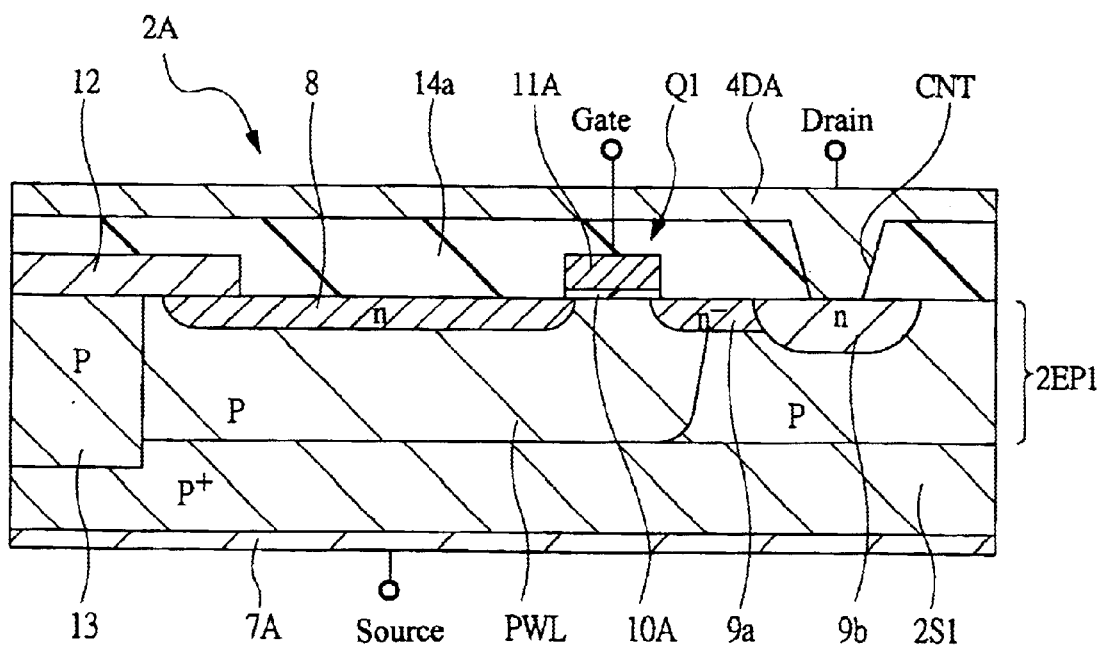
FIG. 8 is a cross-sectional view taken along the line A3—A3 of FIG. 7.

Next, the structure of the chip 2A constituting the combined power MOS PM described in FIGS. 5 and 6 will be described in detail based on FIGS. 7 and 8. FIGS. 7 and 8 show the structure of the power MOS Q1 in the high side. FIG. 7 is a plan view of the chip 2A, and FIG. 8 is a cross-sectional view taken along the line A3—A3 of FIG. 7.

A semiconductor substrate 2S1 constituting the chip 2A is made of, for example, $p^+$ type single crystal silicon. On a rear surface of the semiconductor substrate 2S1, a conductor film 7A made of, for example, aluminum is deposited by the evaporation method or the sputtering method. This conductor film 7A forms the source electrode (outer terminal for a source) of the power MOS Q1. Specifically, a source potential is supplied from the rear surface of the chip 2A in this structure. On the other hand, on a main surface of the semiconductor substrate 2S1, an epitaxial layer 2EP1 made of, for example, p type single crystal silicon is formed. A p well PWL is formed in this epitaxial layer 2EP1. For example, boron (B) is introduced into the semiconductor substrate 2S1, the epitaxial layer 2EP1, and the p well PWL. In this epitaxial layer 2EP1 (including the p well PWL) on the main surface of the chip 2A, a plurality of horizontal power MOSs Q1 are formed, and the whole of them constitutes one power MOS Q1. FIG. 8 shows one of the plurality of power MOSs Q1.

Each of the power MOSs Q1 has an n type semiconductor region for a source 8, an $n^-$ type semiconductor region for a drain 9a, an n type semiconductor region 9b, a gate insulating film 10A, and a gate electrode 11A. The n type semiconductor region for a source 8 is formed by introducing, for example, phosphorus (P) or arsenic (As) into the p well PWL. The n type semiconductor region 8 is electrically connected to a conductor film 12 formed on a main surface of the epitaxial layer 2EP1. The conductor film 12 is made of, for example, low resistance polysilicon. It is possible to make the resistance of the conductor film 12 lower by using, for example, a metal film such as aluminum or aluminum alloy to constitute the conductor film 12. This conductor film 12 is electrically connected to a p type semiconductor region 13 formed in the epitaxial layer 2EP1 and the semiconductor substrate 2S1. This p type semiconductor region 13 is formed by distributing impurities such as boron from the main surface of the epitaxial layer 2EP1 to the semiconductor substrate 2S1. In other words, the n type semiconductor region for a source 8 in the power MOS Q1 is electrically connected to the conductor film 7A for a source electrode formed on the rear surface of the chip 2A via the conductor film 12 on the main surface of the chip 2A, the p type semiconductor region 13, and the semiconductor substrate 2S1. It is also possible to make a trench extending to the semiconductor substrate 2S1 in the epitaxial layer 2EP1 and bury the low resistance polysilicon in the trench instead of the p type semiconductor region 13. Alternatively, a metal film such as aluminum may be deposited.

On the other hand, the $n^-$ type semiconductor region for a drain 9a of the power MOS Q1 is formed so as to cover both of the p well PWL and the epitaxial layer 2EP1. Also, the n type semiconductor region 9b is formed in the epitaxial layer 2EP1. The $n^-$ type semiconductor region 9a and the ntype semiconductor region 9b are made by introducing, for example, phosphorus (P) or arsenic (As) thereinto and are electrically connected to each other. This n type semiconductor region 9b is electrically connected to the drain extraction electrode 4DA via a contact hole CNT bored through an interlayer insulating film 14a. The interlayer insulating film 14a is made of, for example, phospho silicate glass (PSG) and is formed so as to cover the gate electrode 11A and the conductor film 12. The gate electrode 11A, the conductor film 12, and the drain extraction electrode 4DA are insulated from each other by the interlayer insulating film 14a. As described above, in the horizontal power MOS Q1 according to this embodiment, the gate extraction electrode 4GA and the drain extraction electrode 4DA are all arranged on a main surface of the chip 2A (on the interlayer insulating film 14a). In other words, the gate potential and the drain potential are supplied from the main surface side of the chip 2A.

The gate electrode 11A is made of, for example, low-resistance polysilicon and is electrically connected to the gate extraction electrode 4GA. In this embodiment, when the gate electrode 11a is patterned, the conductor film 12 is also patterned simultaneously. The gate insulating film 10A under the gate electrode 11A is made of, for example, a silicon oxide film. In such a power MOS Q1, a semiconductor region for forming a channel (a semiconductor region for forming a channel having a second conductive type) is formed between the n type semiconductor region 8 and the $n^-$ type semiconductor region 9a under the gate electrode 11A. Specifically, since the power MOS Q1 is a horizontal type, the drain current in the channel flows along the main surface of the epitaxial layer 2EP1. In addition, in such a structure of the chip 2A, the drain current flows from the drain extraction electrode 4DA in the main surface side of the chip 2A to the conductor film 7A for a source electrode in the rear surface side of the chip 2A through the n type semiconductor region 9b, $n^-$ type semiconductor region 9a, the channel (in a state in which the conductive type of the semiconductor region for forming a channel is reversed), the n type semiconductor region 8, the conductor film 12, p type semiconductor region 13, and the semiconductor substrate 2S1. Subsequently, the current flows to the drain electrode of the power MOS Q2 of the chip 2B through the frame 1. Note that an insulating film for surface protection is formed on an uppermost surface of the chip 2A, and the insulating film covers most of the gate extraction electrode 4GA and the drain extraction electrode 4DA. The gate extraction electrode 4GA and the drain extraction electrode 4DA are exposed in parts from the insulating film for surface protection, and the wires 5a are connected to the exposed regions.

In the horizontal power MOS Q1 as described above, the source and the drain thereof must be formed separately from each other to some extent in line with the need to ensure the withstand pressure between the source and the drain. Therefore, scaling down of the horizontal power MOS Q1 is difficult. To the contrary, it is possible to increase the distance between the gate electrode 11A and the drain in comparison to the case of the vertical MOS. Therefore, the gate-drain parasitic capacitance can be reduced.

Figure 9:
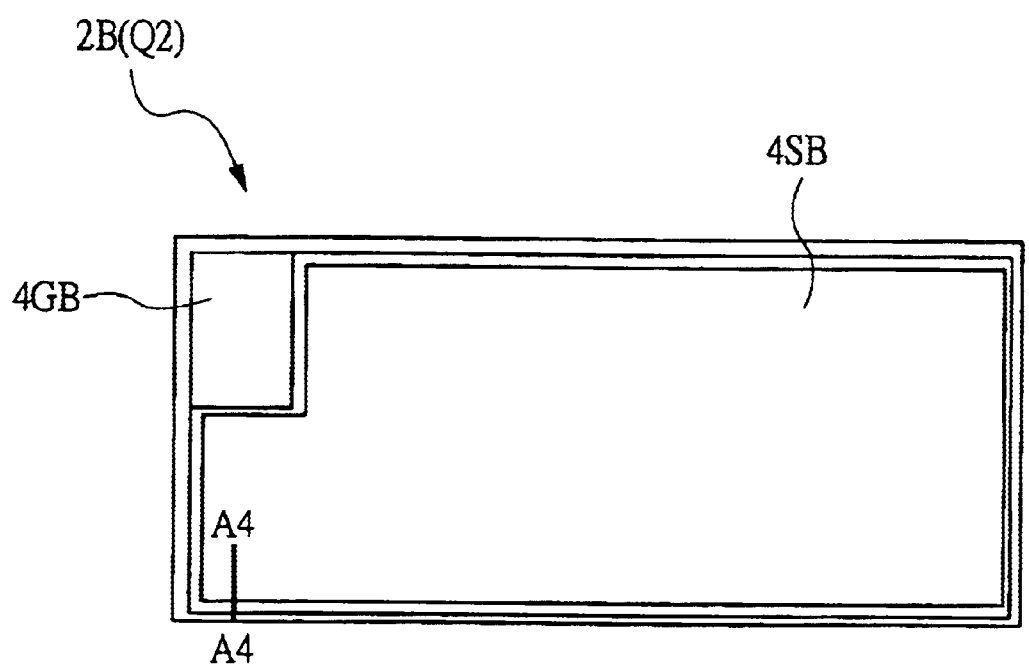
FIG. 9 is a plan view showing the other of the semiconductor chips constituting the combined power MOSFET of FIG. 5.
Figure 10:
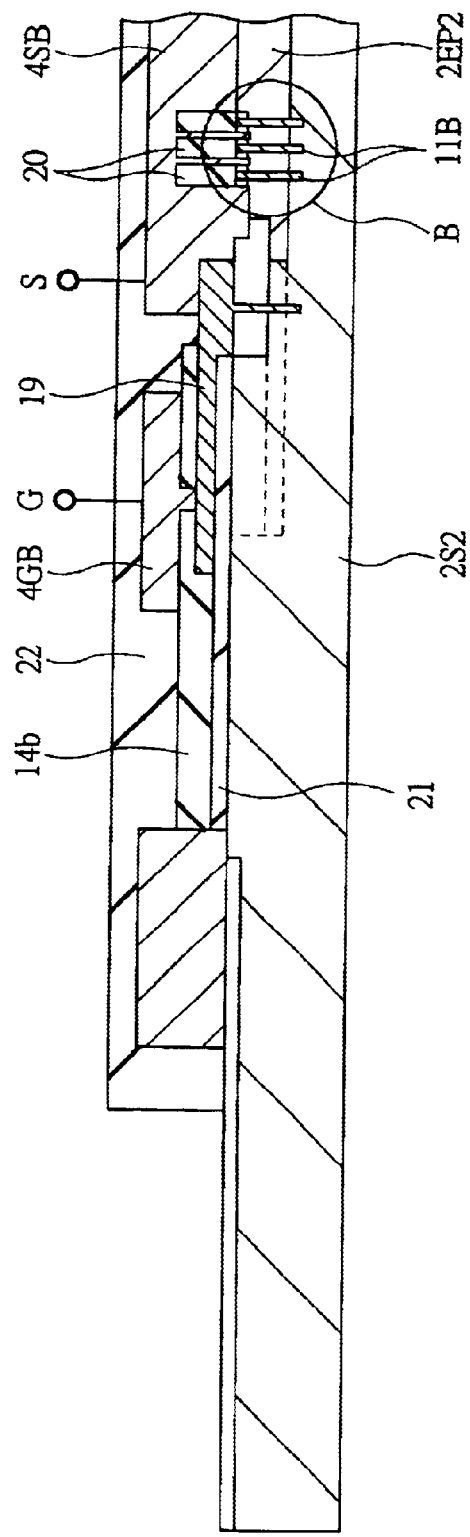
FIG. 10 is a cross-sectional view taken along the line A4—A4 of FIG. 9.
Figure 11:
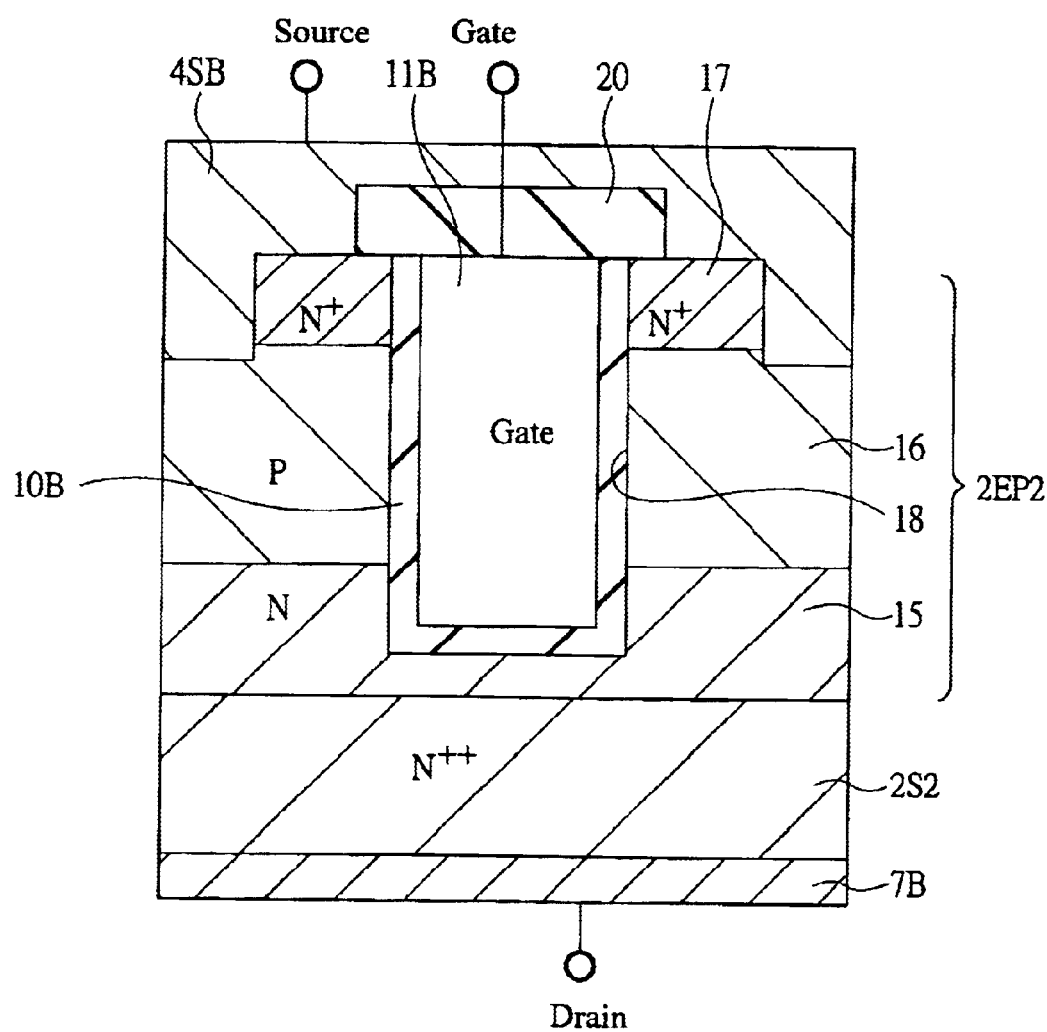
FIG. 11 is an enlarged view of the region B in FIG. 10.

Next, the structure of each chip 2B constituting the combined power MOS PM described in FIGS. 5 and 6 will be described in detail based on FIGS. 9 to 11. FIGS. 9 to 11 show the structure of the power MOS Q2 in the low side. FIG. 9 is a plan view of the chip 2B, FIG. 10 is a cross-sectional view taken along the line A4—A4 of FIG. 9, and FIG. 11 is an enlarged plan view of a region B in FIG. 10.

A semiconductor substrate 2S2 constituting the chip 2B is made of, for example, $n^{++}$ type single crystal silicon. A conductor film 7B made of, for example, aluminum is deposited on a rear surface of the semiconductor substrate 2S2 by the evaporation method or the sputtering method. The conductor film 7B forms a drain electrode (outer terminal for a drain) of the power MOS Q2. On the other hand, an epitaxial layer 2EP2 made of, for example, n type single crystal silicon is formed on a main surface of the semiconductor substrate 2S2. An n type semiconductor region 15 constituted of the epitaxial layer 2EP2 itself, a p type semiconductor region 16 formed thereon, and an $n^+$ type semiconductor region 17 formed thereon are provided in this epitaxial layer 2EP2. For example, phosphorus or arsenic is introduced into the n type semiconductor region 15 and the $n^+$ type semiconductor region 17. For example, boron is introduced into the p type semiconductor region 16.

A plurality of the vertical power MOSs Q2 are formed in this chip 2B and whole of them constitutes one power MOS Q2. FIG. 11 shows one of the plurality of the power MOSs Q2. Herein, a vertical power MOS Q2 having, for example, a trench gate structure is exemplified. Specifically, a gate electrode 11B of the power MOS Q2 is buried in a trench 18 dug in the thickness direction of the epitaxial layer 2EP2 via a gate insulating film 10B formed on the inner surface of the trench 18. The adoption of the buried-gate structure as described above makes it possible to scale down the power MOS Q2, and thereby the integration degree of the power MOS Q2 can be improved. The gate insulating film 10B is made of, for example, silicon oxide. The gate electrode 11B is made of, for example, low-resistance polysilicon and is electrically connected to a gate extraction electrode 4GB on a main surface of the chip 2B via a conductor film 19 shown in FIG. 10. The conductor film 19 is made of, for example, low-resistance polysilicon. A cap insulating film 20 is deposited on the gate electrode 11B, whereby the gate electrode 11B and the gate extraction electrode 4SB are insulated from each other. An interlayer insulating film 14b made of, for example, PSG is deposited on a main surface of the epitaxial layer 2EP2. The conductor film 19 is covered with the interlayer insulating film 14b, whereby the conductor film 19 and the source extraction electrode 4SB are insulated from each other.

The $n^+$ type semiconductor region 17 is a region in which a source of the power MOS Q2 is formed, and is electrically connected to the source extraction electrode 4SB in the main surface side of the chip 2B. Also, the n type semiconductor region 15 and the semiconductor substrate 2S2 are regions in which a drain of the power MOS Q2 is formed. In the power MOS Q2 like this, a semiconductor region for forming a channel (semiconductor region for forming a channel having the second conductive type) is formed in a portion opposite to the side surface of the gate electrode 11B in the p type semiconductor region 16 between the n type semiconductor region 15 and the $n^+$ semiconductor region 17. Specifically, since the power MOS Q2 is a vertical type, a drain current in the channel (in a state in which the conductive type of the semiconductor region for forming a channel is reversed) flows along the thickness direction (along the depth direction of the trench 18) of the epitaxial layer 2EP2 (p type semiconductor region 16). In other words, the drain current flown through the frame 1 to the conductor film 7B for a drain electrode flows to the source extraction electrode 4SB through the semiconductor substrate 2S2, the n type semiconductor region 15, p type semiconductor region 16 (channel), and the $n^+$ type semiconductor region 17. Note that an insulating film 21 formed on the main surface of the epitaxial layer 2EP2 in FIG. 10 shows a field insulating film for element separation. Also, an insulating film 22 formed on the uppermost layer of the chip 2B shows a surface protection film. The insulating film 22 is made of, for example, polyimide resin, and the insulating film 22 covers most of the gate extraction electrode 4GB and the source extraction electrode 4SB. The gate extraction electrode 4GB and the source extraction electrode 4SB are exposed in parts from the insulating film 22, and the wires 5b are connected to the exposed regions.

Since the scaling down of the vertical power MOS Q2 like this is easily performed, the gate-drain capacitance becomes large. Contrary to this, the channel length thereof can be made short, which makes it possible to increase the mutual conductance. Therefore, the small on-resistance can be obtained.

According to the embodiment as described above, the advantages as follows can be obtained.
(1) High-frequency operation of the VRM is enabled.
(2) Since the inductance component in the VRM can be reduced, the adverse effect and the noise in the high-frequency operation of the VRM can be reduced or prevented. Thus, it becomes possible to provide a VRM having high reliability.
(3) The improvement of the power supply efficiency of a VRM is enabled.
(4) Since the PWM frequency can be improved, the size of the coil 1L can be reduced. Thus, it becomes possible to reduce the size of the VRM.
(5) It becomes possible to provide a VRM capable of coping with a low operating voltage of a CPU.

(Second Embodiment)

In this second embodiment, a structure of the combined power MOS where the electrodes of each chip and the leads are connected through bump electrodes is employed. Except that, the second embodiment is the same as the first embodiment.

Figure 12A:
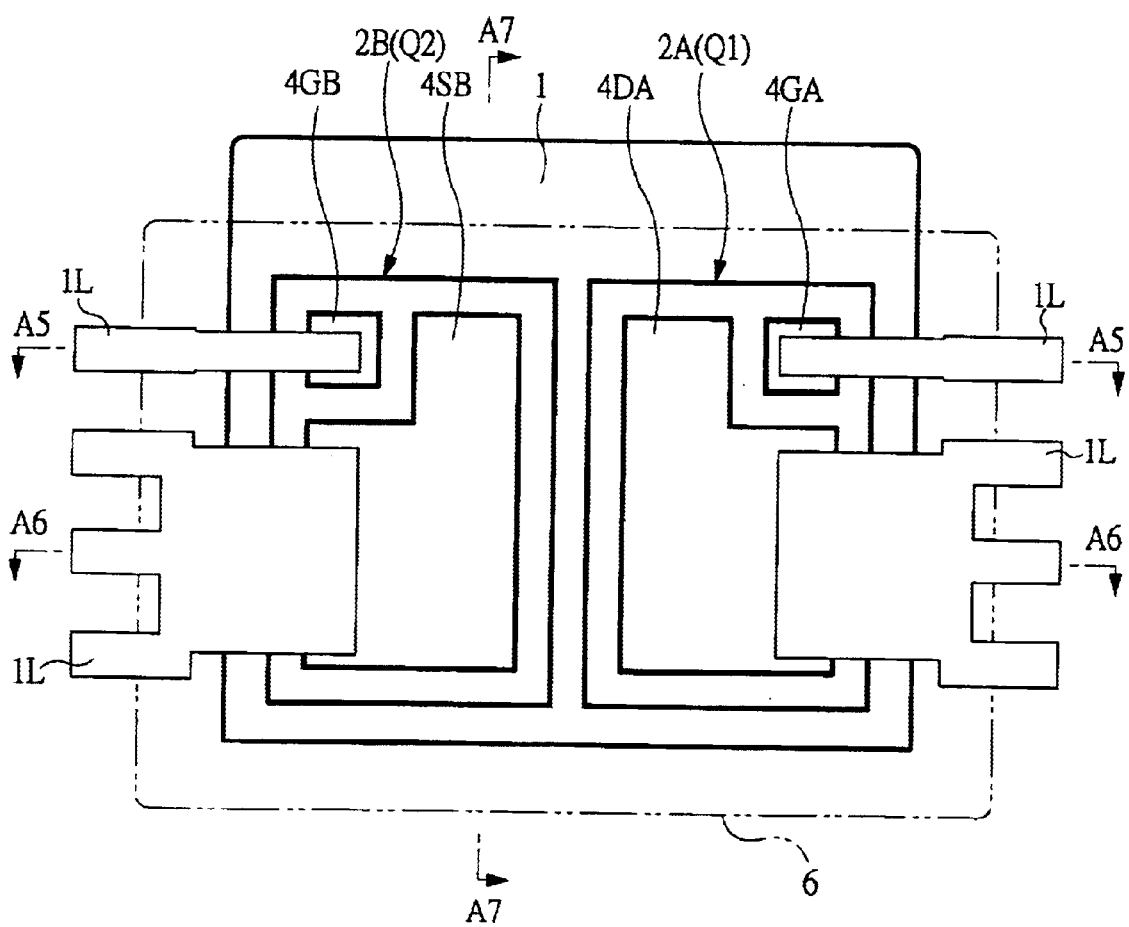
FIG. 12A is a plan view of a combined power MOSFET according to another embodiment of the present invention.
Figure 12B:
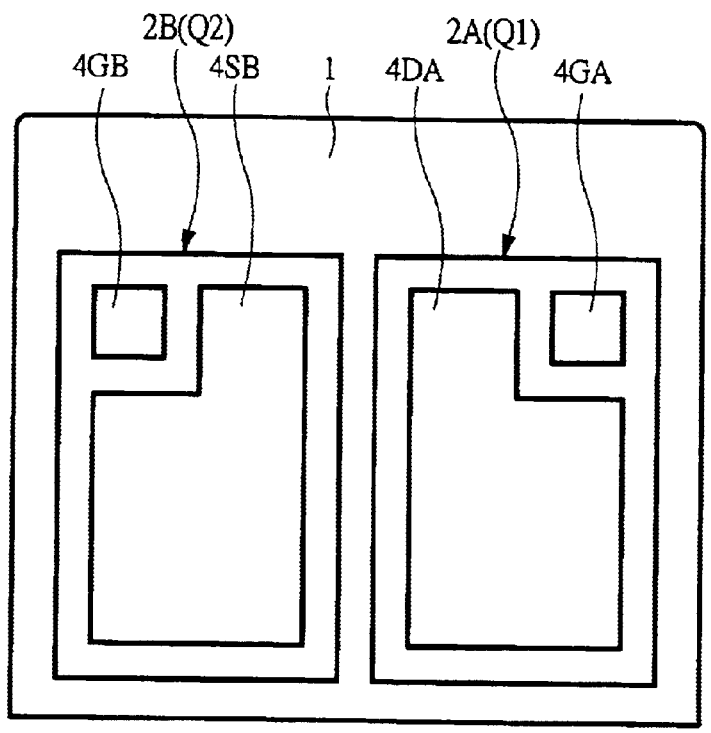
FIG. 12B is a plan view showing the combined power MOSFET of FIG. 12A after removing seal resin and lead wire.
Figure 13A:
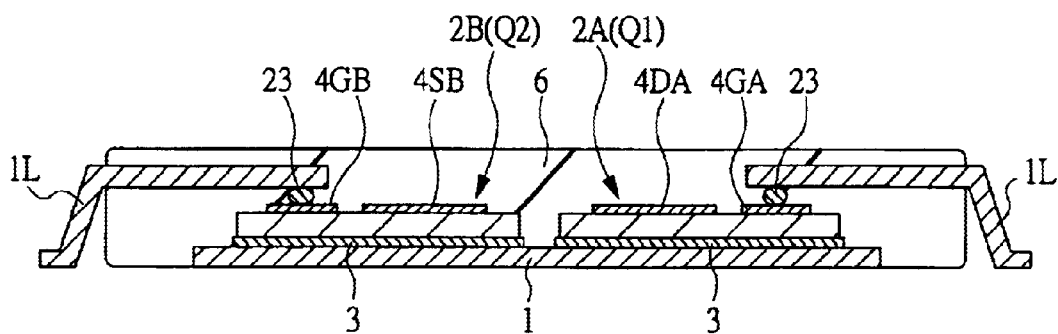
FIG. 13A is a cross-sectional view taken along the line A5—A5 of FIG. 12A.
Figure 13B:
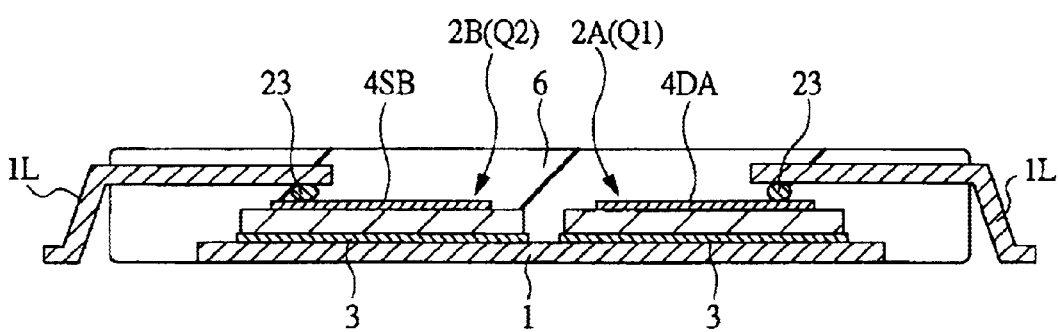
FIG. 13B is a cross-sectional view taken along the line A6—A6 of FIG. 12A.
Figure 13C:
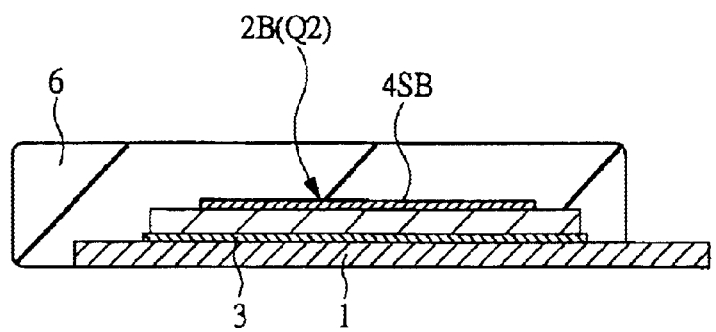
FIG. 13C is a cross-sectional view taken along the line A7—A7 of FIG. 12A.

FIG. 12A is a plan view of the combined power MOS PM, and FIG. 12B is a plan view of the combined power MOS PM of FIG. 12A in which the leads and the sealing resin are removed. Also, FIGS. 13A to 13C are cross-sectional views taken along the lines A5—A5, A6—A6, and A7—A7 of FIG. 12A. The end portions of the leads 1L in the chip side are arranged such that the end portions extend to the positions where they overlap the gate extraction electrodes 4GA and 4GB, the drain extraction electrode 4DA, and the source extraction electrode 4SA of the chips 2A and 2B. Also, the end portions of the leads 1L are joined and electrically connected to the gate extraction electrodes 4GA and 4GB, the drain extraction electrode 4DA, and the source extraction electrode 4SA through bump electrodes 23 made of, for example, gold (Au).

According to the second embodiment described above, the advantages as follows can be obtained in addition to those obtained in the first embodiment. Specifically, the inductance can be reduced by connecting the leads 1L to the gate extraction electrodes 4GA and 4GB, the drain extraction electrode 4DA, and the source extraction electrode 4SA by the bump electrodes 23. Therefore, it becomes possible to improve the power supply efficiency. Also, it is possible to suppress or prevent the noise. In addition, since it is possible to do away with a wire loop, the thinner design of the sealing resin can be promoted.

(Third Embodiment)

In the first and second embodiments, the structures of the combined power MOSs in which two chips are arranged on the same main surface of the frame have been described. In this third embodiment, the case where each one of the two chips is mounted on a main surface and a rear surface of a frame will be described. Other structure thereof is the same as that of the first embodiment.

Figure 14A:
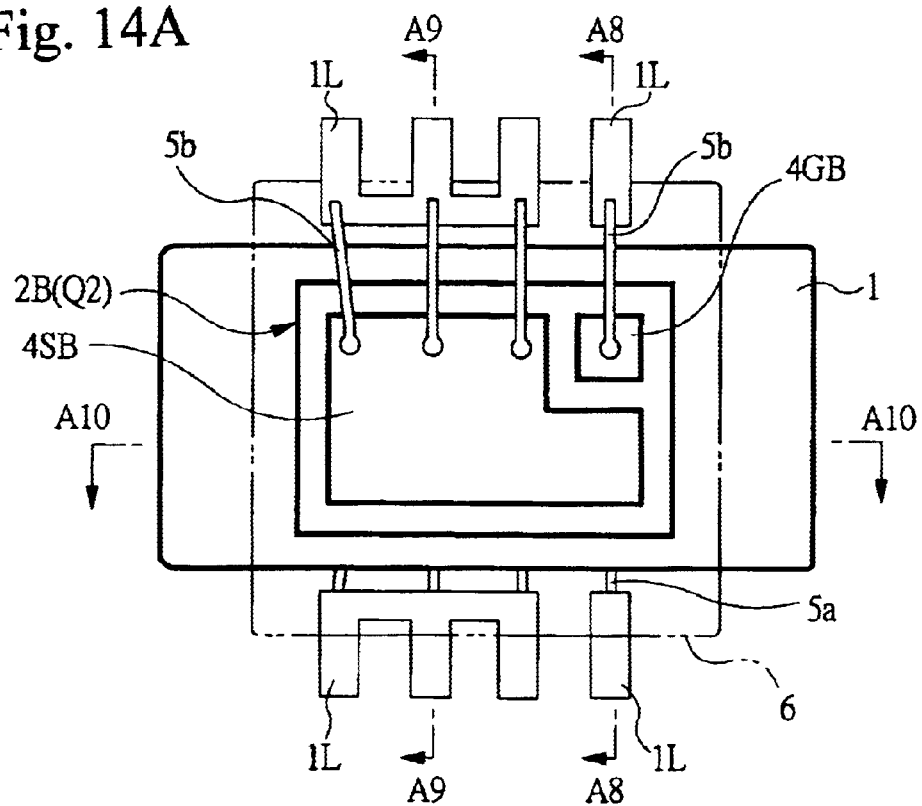
FIG. 14A is a plan view of a combined power MOSFET seen from one side according to still another embodiment of the present invention.
Figure 14B:
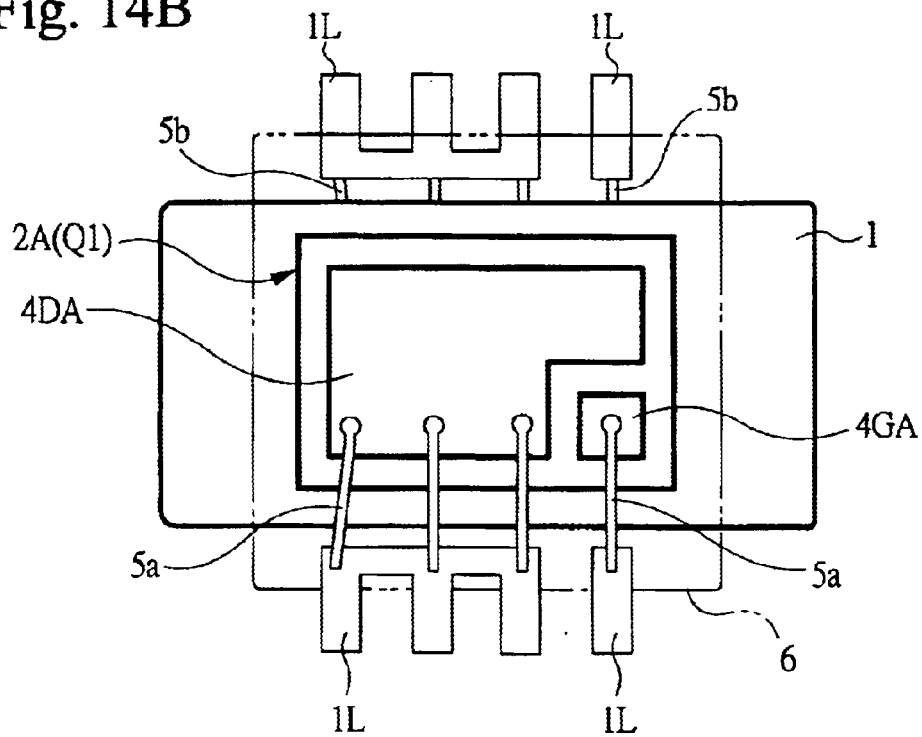
FIG. 14B is a plan view of the same seen from the other side.
Figure 15A:
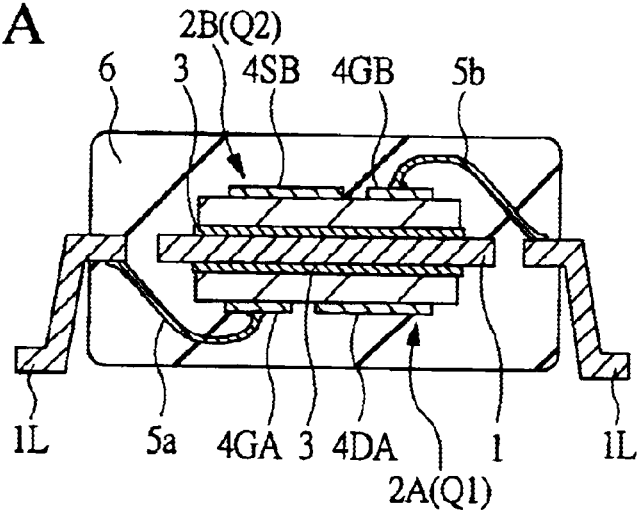
FIG. 15A is a cross-sectional view taken along the line A8—A8 of FIG. 14A.
Figure 15B:
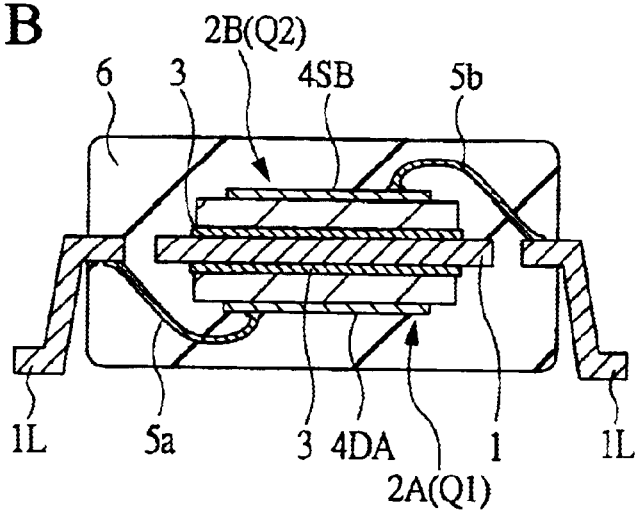
FIG. 15B is a cross-sectional view taken along the line A9—A9 of FIG. 14A.
Figure 15C:
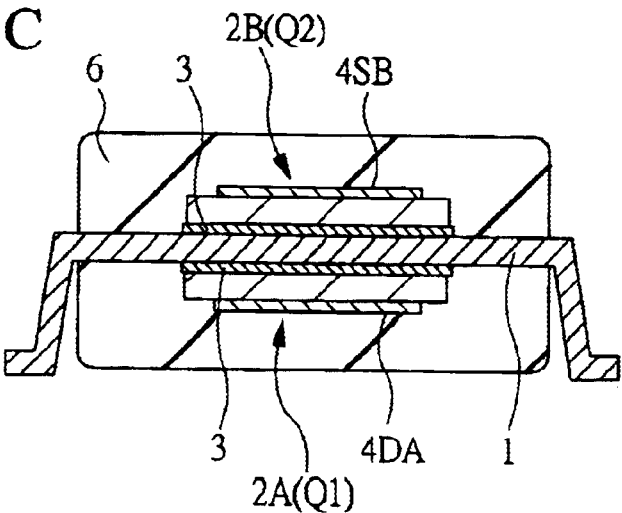
FIG. 15C is a cross-sectional view taken along the line A10—A10 of FIG. 14A.

FIG. 14A is a plan view showing the combined power MOS PM seen from one side, and FIG. 14B is a plan view showing the combined power MOS PM of FIG. 14A seen from the other side. In addition, FIGS. 15A to 15C are cross-sectional views taken along the lines A8—A8, A9—A9, and A10—A10 of FIG. 14A.

The chip 2B is adhered and electrically connected to the one surface of the frame 1 via the adhesive 3. Also, the chip 2A is adhered and electrically connected to the rear surface of the frame 1 via the adhesive 3. The gate extraction electrodes 4GA and 4GB, the drain extraction electrode 4DA, and the source extraction electrode 4SB of the chips 2A and 2B are respectively connected to the leads IL via the wires 5a and 5b.

The chips 2A and 2B, the wires 5a and 5b, the leads 1L, and the frame 1 are sealed by the sealing resin 6. The end portions of the leads 1L are exposed from the sealing resin 6 and are molded in the gull-wing shape. Also, the end portions are electrically connected to the wiring through the land of the circuit board CB. In addition, both edges of the frame 1 are exposed from the sealing resin 6, are molded in the gull-wing shape, and are joined to the land of the circuit board CB, thereby forming a heat radiation path. Specifically, the heat generated at the operation of the chips 2A and 2B transmits to the circuit board CB through the frame 1 to be radiated.

According to the third embodiment described above, the advantages as follows can be obtained in addition to those obtained in the first embodiment. Specifically, since each one of the two chips 2A and 2B is mounted on one surface and a rear surface of the frame 1, respectively, the mounting area of the combined power MOS PM can be made smaller. Therefore, it becomes possible to promote the downsizing of the VRM.

(Fourth Embodiment)

The fourth embodiment is a modification example of the third embodiment. In this fourth embodiment, the case where electrodes of each chips in the combined power MOS are connected to the leads via the bump electrodes will be described. Except that, the fourth embodiment is the same as the third embodiment.

Figure 16A:
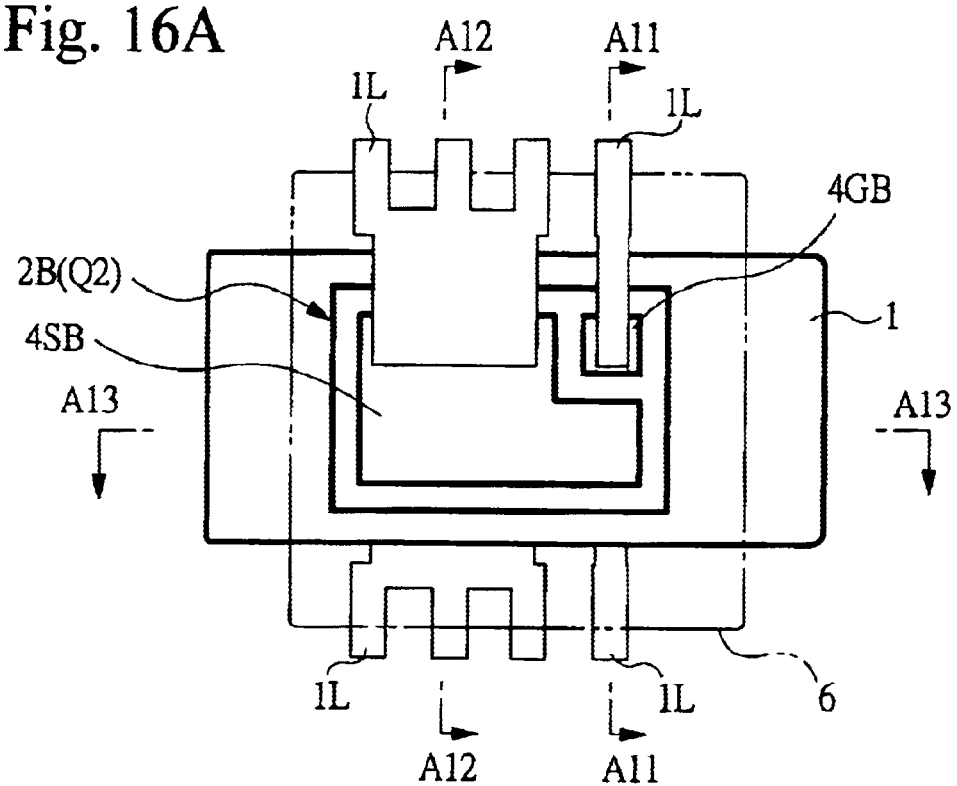
FIG. 16A is a plan view of a combined power MOSFET according to another embodiment of the present invention.
Figure 16B:
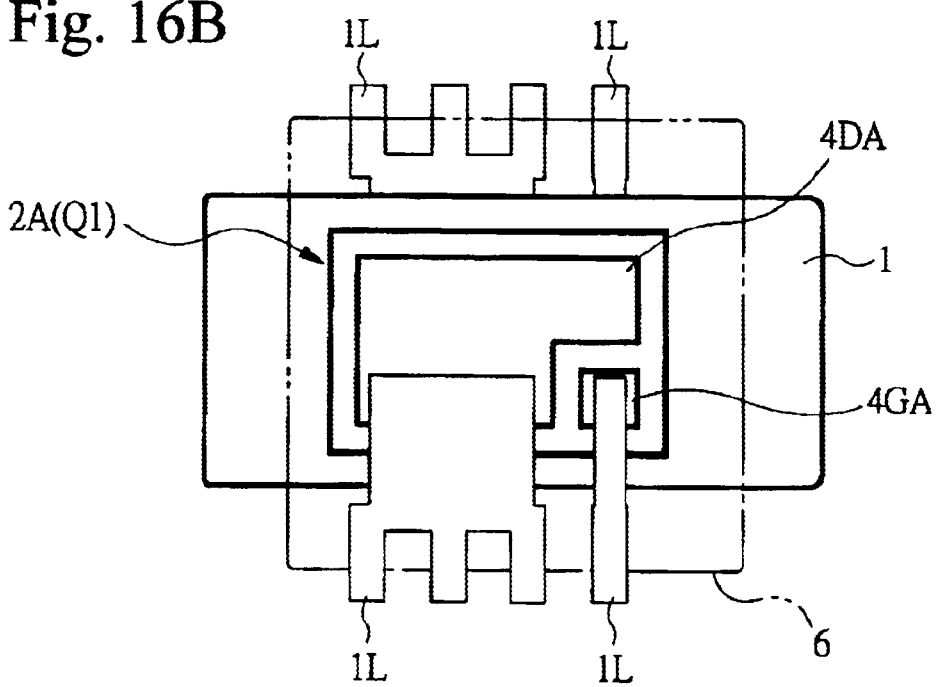
FIG. 16B is a plan view of the same seen from the other side.
Figure 17A:
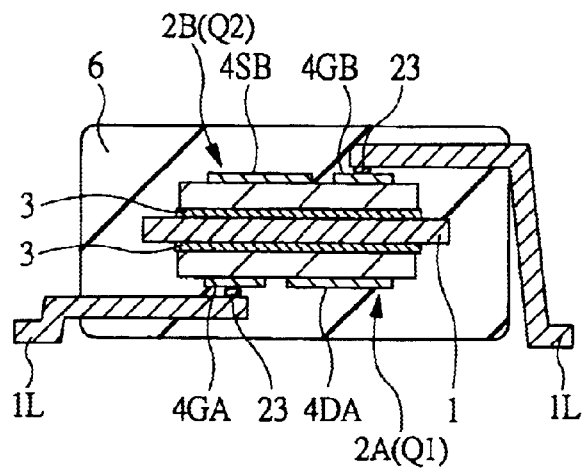
FIG. 17A is a cross-sectional view taken along the line A11—A11 of FIG. 16A.
Figure 17B:
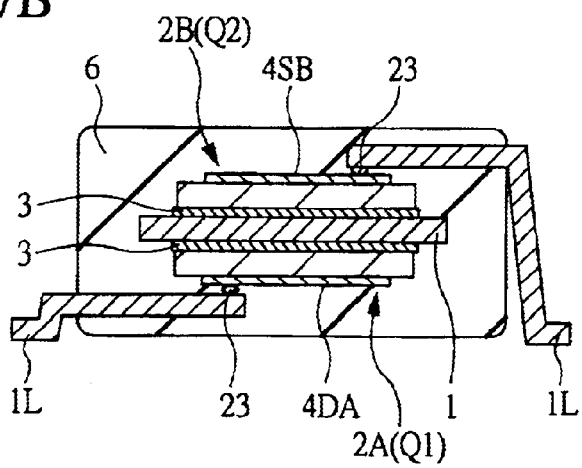
FIG. 17B is a cross-sectional view taken along the line A12—A12 of FIG. 16A.
Figure 17C:
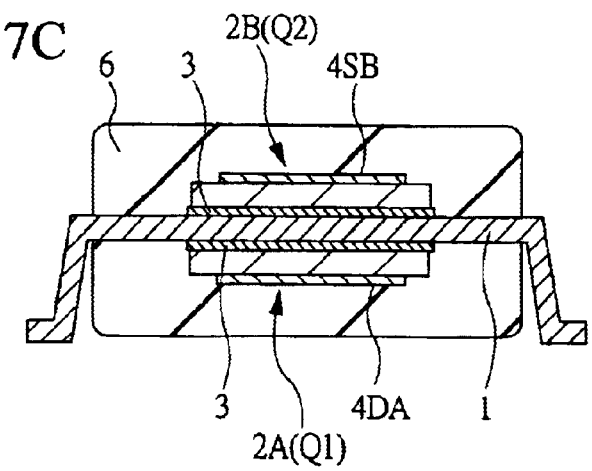
FIG. 17C is a cross-sectional view taken along the line A13—A13 of FIG. 16A.

FIG. 16A is a plan view of the combined power MOS PM, and FIG. 16B is a plan view showing the rear surface of the combined power MOS PM shown in FIG. 16A. Also, FIGS. 17A to 17C are cross-sectional views taken along the lines A11—A11, A12—A12, and A13—A13 of FIG. 16A. The end portions of the leads 1L in the chip side are arranged such that the end portions extend to the positions where they overlap the gate extraction electrodes 4GA and 4GB, the drain extraction electrode 4DA and the source extraction electrode 4SA of the chips 2A and 2B. Also, the end portions of the leads 1L are joined and electrically connected to the gate extraction electrodes 4GA and 4GB, the drain extraction electrode 4DA, and the source extraction electrode 4SA through the bump electrodes 23.

According to the fourth embodiment described above, the advantages obtained in the second and third embodiments can be obtained.

(Fifth Embodiment)

In this fifth embodiment, a modification example of the horizontal power MOS in the high side will be described. In this embodiment, the case where a normal horizontal power MOS is used will be described.

Figure 18A:
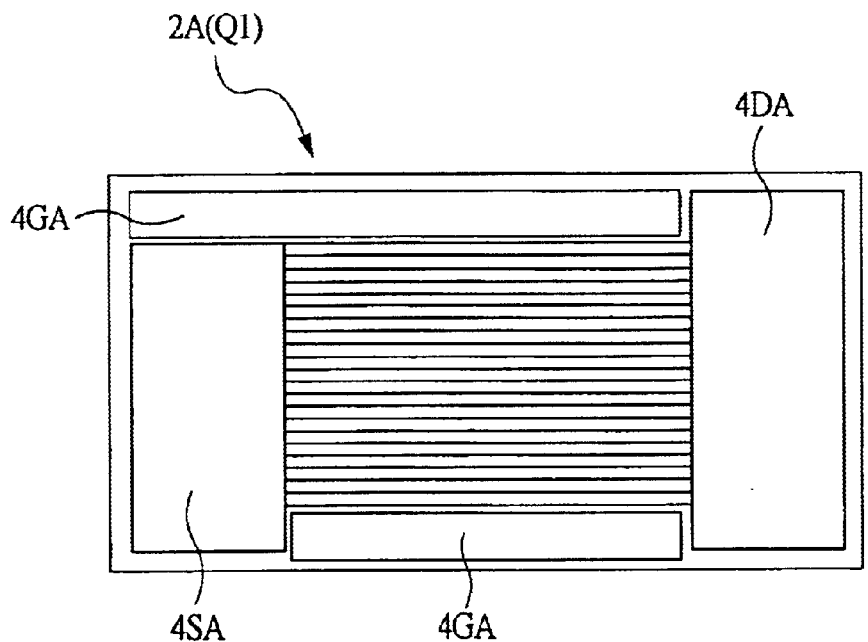
FIG. 18A is a plan view showing one of the power MOSFETs constituting a combined power MOSFET according to another embodiment of the present invention.
Figure 18B:
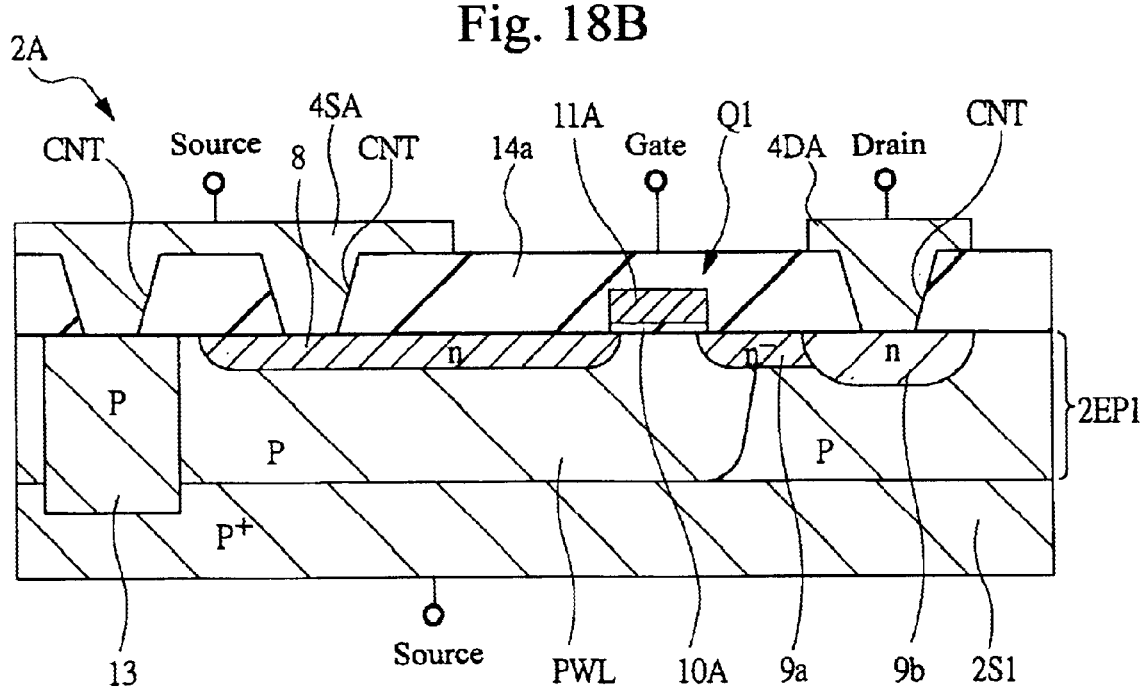
FIG. 18B is a cross-sectional view showing a principal portion of FIG. 18A.
Figure 19:
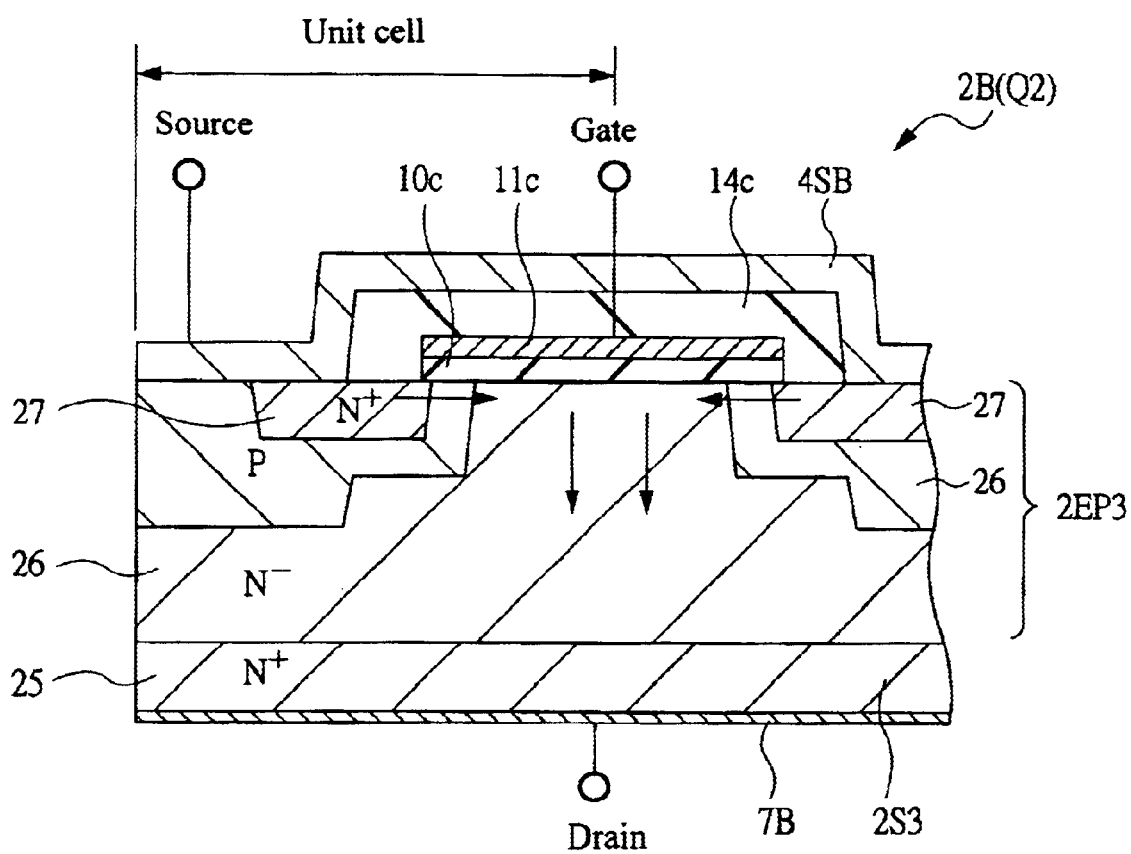
FIG. 19 is a cross-sectional view showing a principal portion of one of the power MOSFETs constituting a combined power MOSFET according to still another embodiment of the present invention.

FIG. 18 is a plan view showing the main surface side of the chip 2A having the power MOS Q1, and FIG. 19 is a cross-sectional view showing the principal portion of FIG. 18. The element structure thereof is almost identical to that of the first embodiment. The difference is that the source extraction electrode 4SA is arranged in the main surface side of the chip 2A in addition to the gate extraction electrode 4GA and the drain extraction electrode 4DA. This source extraction electrode 4SA is made of, for example, aluminum or aluminum alloy and is electrically connected to the n type semiconductor region 8 and the p type semiconductor region 13 via the contact hole CNT bored through the interlayer insulating film 14a, by which both of the semiconductor regions 8 and 13 are electrically connected to each other. The rear surface of the chip 2A (surface opposite and connected to the frame 1) functions as the source of the power MOS Q1 similarly to the first embodiment.

In the case where the chip 2A is mounted on the frame 1, the source extraction electrode 4SA on the main surface of the chip 2A are electrically connected to the frame 1 by the use of a wire. In this case, however, the rear surface of the chip 2A also functions as the source, and the rear surface and the frame 1 are electrically connected to each other. Specifically, also in this fifth embodiment, the power MOSs Q1 and Q2 are connected in series through the frame 1. Due to this, the influence of the inductance caused by the wire can be reduced.

According to the fifth embodiment described above, since it is impossible to remove the wire for connecting the gate extraction electrode 4GA of the chip 2A and the frame 1, there is some influence of the inductance caused by the wire, and the area necessary to the wire is inevitably required. Except that, however, the same advantages as those of the first embodiment can be obtained.

(Sixth Embodiment)

In this sixth embodiment, a modification example of the vertical power MOS in the low side will be described.

FIG. 19 is a cross-sectional view showing the principal portion of the vertical power MOS Q2. A semiconductor substrate 2S3 is made of, for example, $n^+$ type single crystal silicon and forms a drain region of the vertical power MOS Q2. The conductor film 7B is deposited on the rear surface of the semiconductor substrate 2S3. This conductor film 7B serves as the drain electrode of the power MOS Q2. On the other hand, an epitaxial layer 2EP3 made of, for example, $n^-$ single crystal silicon is formed on the upper surface of the semiconductor substrate 2S3. An n type semiconductor region 25 constituted of the epitaxial layer 2EP3 itself is formed in this epitaxial layer 2EP3. P type semiconductor regions 26 are formed so as to separate from each other in this $n^-$ type semiconductor region 25. Also, an n+type semiconductor region 27 is formed in each of the p type semiconductor regions 26. Specifically, the p type semiconductor regions 26 are arranged so as to be interposed between the $n^-$ type semiconductor region 25 and the $n^+$ type semiconductor region 27 in the main surface of the epitaxial layer 2EP3. The $n^+$ type semiconductor region 27 is a region for forming the source region of the vertical power MOS Q2 and is electrically connected to the source extraction electrode 4SB. Note that, for example, phosphorus or arsenic is contained in the $n^-$ type semiconductor region 25 and the $n^+$ type semiconductor region 27. For example, boron is contained in the p type semiconductor region 26.

A gate electrode 11C made of, for example, low-resistance polysilicon is formed on the main surface of the epitaxial layer 2EP3 via a gate insulating film 10C made of, for example, silicon oxide. The gate electrode 11C is covered with an interlayer insulating film 14c on its surface, and thereby insulated from the source extraction electrode 4SB. The gate electrode 11C is arranged such that both end portions thereof overlap the $n^-$ type semiconductor region 25, the $n^+$ type semiconductor region 27, and the p type semiconductor region 26 interposed between the semiconductor regions 25 and 27. In this structure, a channel is formed in the part of the p type semiconductor region 26 under the gate electrode 11c interposed between the $n^-$ type semiconductor region 25 and the $n^+$type semiconductor region 27. The drain current flows from the conductor film 7B for a drain electrode to the source extraction electrode 4SB through the semiconductor substrate 2S3, $n^-$ type semiconductor region 25, the p type semiconductor region 26 under the gate electrode 11C, and the $n^+$ type semiconductor region 27. Note that, since the mounting state of the chip 2B having the horizontal power MOS Q2 as described above is the same as those of the first to fifth embodiments, the description thereof will be omitted.

According to the sixth embodiment described above, the same advantages as those of the first to fifth embodiments can be obtained.

(Seventh Embodiment)

Figure 20:
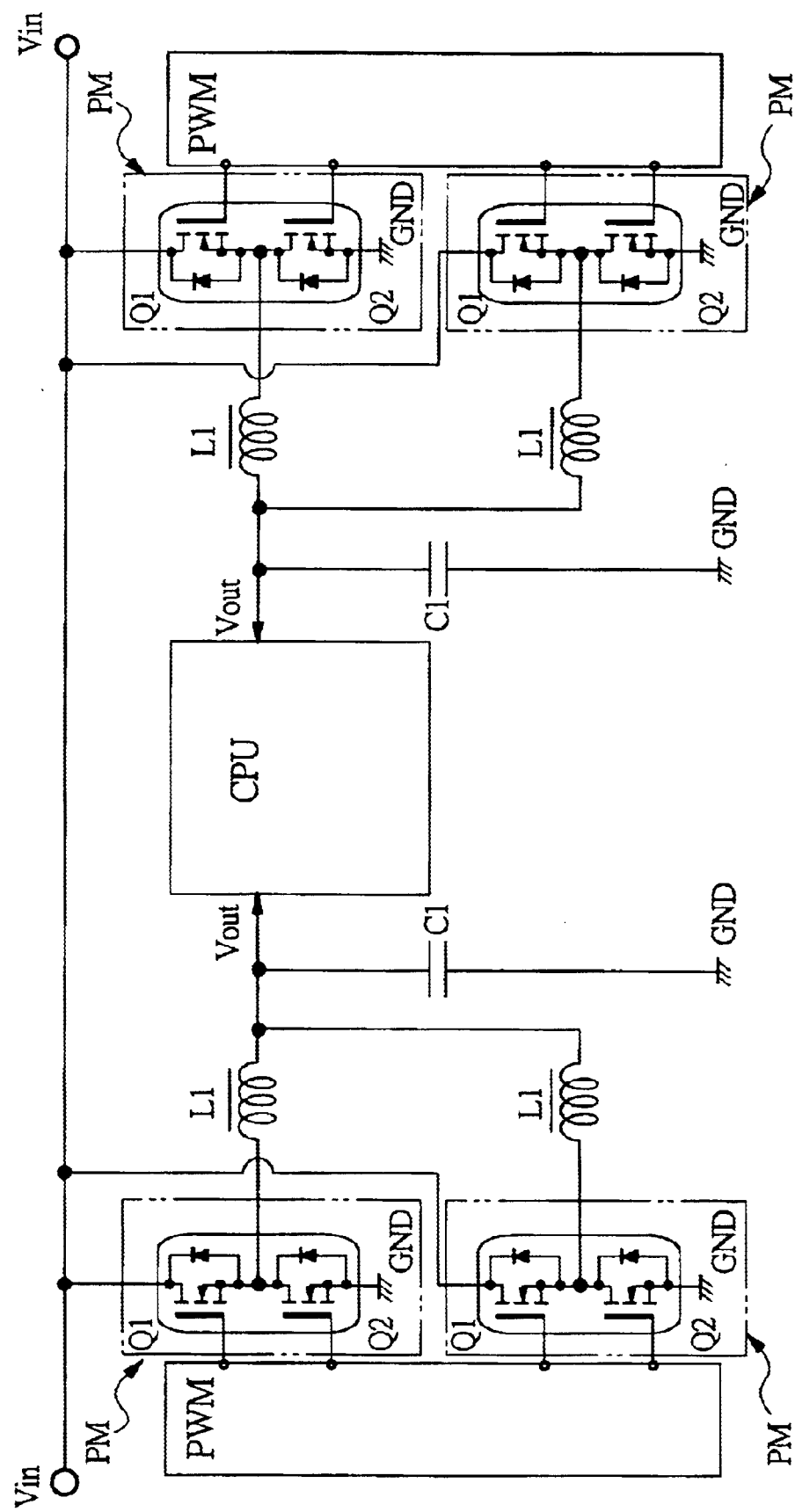
FIG. 20 is a circuit diagram of a four-phase VRM to which the combined power MOSFET according to another embodiment of the present invention is applied.
Figure 21:
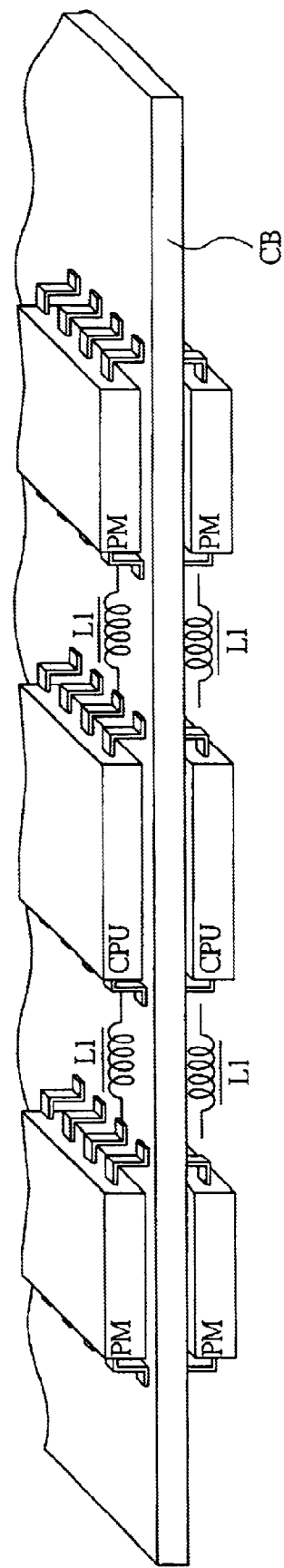
FIG. 21 is a partially broken perspective view showing a state in which each package constituting the VRM of FIG. 20 is mounted.

In this seventh embodiment, an example for mounting a multi-phase VRM will be described. FIG. 20 is a circuit diagram of a four-phase VRM, and FIG. 21 is a partially broken perspective view showing the mounting state thereof. The pulse width modulation circuits PWM are electrically connected to gate electrodes of four combined power MOSs PM. Each of the outputs of the combined power MOSs PM is electrically connected to the input of the CPU via the coil L1 and the electrolytic capacitor C1. Two each of the combined power MOSs PM are mounted on both of the main and rear surfaces of the circuit board CB. Since the inner structure and the package structure of each power MOS PM are the same as those described in the first to sixth embodiments, the description thereof will be omitted.

According to the seventh embodiment described above, it is possible to mount the combined power MOS PM with high density and is also possible to achieve the high-speed reaction.

(Eighth Embodiment)

Figure 22A:
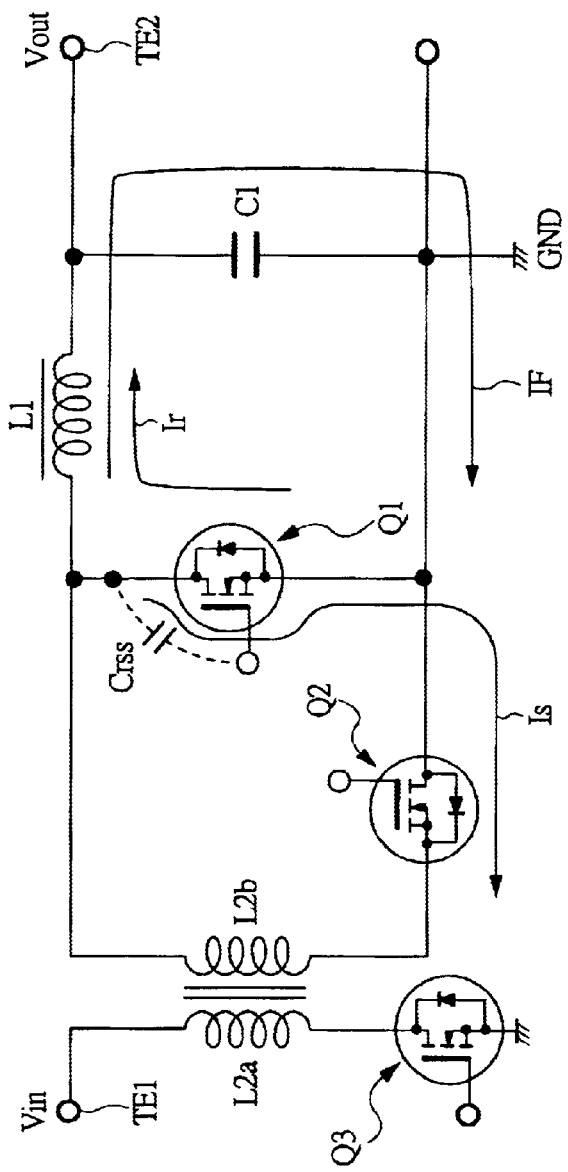
FIG. 22A is a circuit diagram of a power supply circuit according to still another embodiment of the present invention.
Figure 22B:
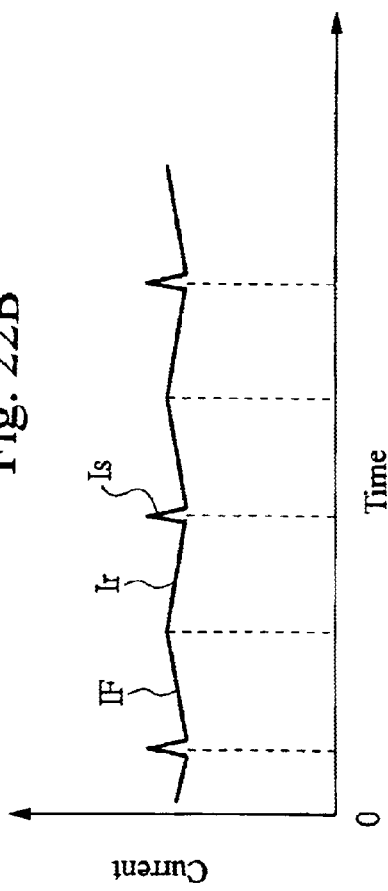
FIG. 22B is a graph showing a current waveform of the same.

FIG. 22A is a circuit diagram of the insulating DC-DC converter according to another embodiment of the present invention, and FIG. 22B shows a current waveform thereof.

A primary coil L2a and a power MOS Q3 are connected between the terminal TE1 to which the input voltage Vin is inputted and the reference potential GND. The structure of the power MOS Q3 may be vertical or horizontal. A secondary coil L2b and the power MOS Q1 are connected in parallel between a terminal TE2 for an output voltage Vout and the reference potential GND. The secondary coil L2b is combined with the primary coil L2a to constitute a transformer. The power MOS Q2 is interposed between the secondary coil L2b and the power MOS Q1. In other words, the source of the power MOS Q2 is connected to the source of the power MOS Q1, and the secondary coil L2b is connected to the drain of the power MOS Q2. A coil L1 is connected between the drain of the power MOS Q1 and the terminal TE2. Also, in the subsequent stage of the coil L1, the electrolytic capacitor C1 is connected in parallel to the power MOS Q1 between the terminal TE2 and the reference potential GND. In this DC-DC converter, when a positive voltage is applied to the secondary side of the transformer, the power MOS Q2 is turned-on to flow a forward current IF. When a negative voltage is applied thereto, a flywheel current Ir flows through the power MOS Q1 due to the counter electromotive voltage of the coil L1.

In this embodiment, the power MOS Q1 is constituted of the horizontal power MOS, and the power MOS Q2 is constituted of the vertical power MOS. The reason why the horizontal power MOS is used as the power MOS Q1 is as follows. Specifically, in this DC-DC converter, a capacitance Crss of the power MOS Q1 is electrically charged due to the rise of the voltage in the secondary side. Consequently, the current Is flows and the power MOSs Q1 and Q2 are simultaneously turned-on due to the self turn-on. This problem becomes severer with the higher frequency operation. Therefore, it is preferable that the power MOS Q1 is constituted of a horizontal MOS having small capacitance.

According to this embodiment, it becomes possible to cope with the high frequency operation. In other words, it is possible to provide a stable power supply without malfunction even in the high frequency operation.

In the foregoing, the invention made by the inventors thereof has been concretely described based on the embodiments. However, it goes without saying that the present invention is not limited to the foregoing embodiments and the various changes and modifications can be made within the scope of the invention.

For example, though the case where a flat package structure is adopted to the packaging structure of the combined power MOS has been described in the first to eighth embodiments, the present invention is not limited to this and various changes can be made therein. For example, a ball grid array (BGA) package structure may be adopted.

In the foregoing description, the description has been made mainly to the case where the present invention made by the inventors thereof is applied to a power supply circuit for driving a CPU, which is an application field of the present invention and is a background of the same. However, the present invention is not limited to this and the present invention can be applied to, for example, a power supply circuit for driving other circuitry.

The advantages achieved by the typical ones of the inventions disclosed in this application will be briefly described as follows.

(1) According to the present invention, a switch in a high side constituting a power supply circuit is constituted of a horizontal field effect transistor, and a switch in a low side is constituted of a vertical field effect transistor, whereby it is possible to reduce a loss in the high side, and is also possible to reduce on-resistance in the low side. Therefore, the improvement of power supply efficiency of the power supply circuit can be achieved.

(2) According to the present invention, a source of the horizontal field effect transistor and a drain of the vertical field effect transistor are joined to a common conductor and are electrically connected to each other, whereby it becomes possible to remove a bonding wire for connecting the horizontal field effect transistor to the conductor. Therefore, inductance components in the power supply circuit can be reduced. Consequently, the noise generation can be suppressed or prevented, and thus, a high frequency operation of the power supply circuit can be achieved.

(3) According to the present invention, based on the (1) and (2), it is possible to obtain a high input frequency in the power supply circuit and is also possible to make a coil in the power supply circuit smaller. Therefore, a semiconductor device having the power supply circuit therein can be reduced in size.

What is claimed is:

1. A semiconductor device, comprising:
   a power supply circuit that comprises:
   a first power supply terminal supplying a first operating voltage and a second power supply terminal supplying a second operating voltage lower than said first operating voltage;
   a first field effect transistor in which a source-drain path is connected in series between said first power supply terminal and an output terminal; and
   a second field effect transistor in which a source-drain path is connected in series between said output terminal and said second power supply terminal,
   wherein said first field effect transistor includes:
   a semiconductor substrate having a first main surface and a second main surface opposite to said first main surface;
   a gate electrode formed on said first main surface of the semiconductor substrate via a gate insulating film;

a source region and a drain region having a first conductive type formed on said first main surface and on both end portions of said gate electrode; and a semiconductor region for forming a channel formed on said first main surface and between said source region and said drain region, the semiconductor region for forming a channel having a second conductive type which is reverse to said first conductive type, and wherein said second field effect transistor includes:

a semiconductor substrate having a first main surface and a second main surface opposite to said first main surface;

a gate electrode formed on said first main surface of the semiconductor substrate via a gate insulating film;

a semiconductor region for forming a channel having the second conductive type, which is formed on said first main surface and a part of which overlaps said gate electrode in two dimensions;

a source region having the first conductive type, which is formed in said semiconductor region for forming a channel and formed on one end portion of said gate electrode; and a drain region formed on said second main surface and formed under said semiconductor region for forming a channel.

2. The semiconductor device according to claim 1, wherein a source of said first field effect transistor and a drain of said second field effect transistor are joined to a common conductor and are electrically connected to each other.

3. The semiconductor device according to claim 1, wherein an outer terminal for a gate and an outer terminal for a drain are provided on a first main surface of a semiconductor chip on which said first field effect transistor is formed, and an outer terminal for a source is provided on a second main surface opposite to said first main surface.

4. The semiconductor device according to claim 1, wherein said second field effect transistor has a trench gate electrode structure in which a gate electrode is provided in a trench dug in a direction cross to a first main surface of a semiconductor chip.

5. The semiconductor device according to claim 2, wherein said first field effect transistor and said second field effect transistor are sealed in the same package.

6. The semiconductor device according to claim 3, wherein said first field effect transistor has a structure in which a semiconductor region for a source formed on said first main surface is electrically connected to said outer terminal for a source provided on said second main surface.

7. The semiconductor device according to claim 6, wherein said first field effect transistor includes: the semiconductor region for a source formed on said first main surface; a semiconductor region for a drain formed on said first main surface; a gate insulating film formed on said first main surface between said semiconductor regions; a gate electrode formed on said gate insulating film; a conductor film formed on said first main surface and electrically connected to said semiconductor region for a source; a semiconductor region formed on said semiconductor chip and functioning to electrically connect said conductor film to said outer terminal for a source; an insulating film deposited so as to cover said gate electrode and said conductor film on said first main surface; said outer terminal for a gate provided on said insulating film and electrically connected to said gate electrode; and said outer terminal for a drain provided on said insulating film and electrically connected to said semiconductor region for a drain.

8. The semiconductor device according to claim 7, wherein said outer terminal for a gate and said outer terminal for a drain arranged on said first surface are electrically connected to leads of a package using bonding wires.

9. The semiconductor device according to claim 7, wherein said outer terminal for a gate and said outer terminal for a drain arranged on said first surface are electrically connected to leads of a package using bump electrodes.

* * * * *